US012446283B2

(12) United States Patent
Wang et al.

(10) Patent No.: US 12,446,283 B2
(45) Date of Patent: Oct. 14, 2025

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Chih-Hao Wang, Hsinchu County (TW); Ching-Wei Tsai, Hsinchu (TW); Yu-Xuan Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 533 days.

(21) Appl. No.: 17/831,087

(22) Filed: Jun. 2, 2022

(65) Prior Publication Data

US 2023/0395696 A1 Dec. 7, 2023

(51) Int. Cl.
*H10D 64/01* (2025.01)
*H10D 30/01* (2025.01)
*H10D 30/67* (2025.01)
*H10D 84/01* (2025.01)
*H10D 84/03* (2025.01)

(52) U.S. Cl.
CPC ......... *H10D 64/017* (2025.01); *H10D 30/031* (2025.01); *H10D 30/6713* (2025.01); *H10D 30/6735* (2025.01); *H10D 64/021* (2025.01); *H10D 84/013* (2025.01); *H10D 84/0147* (2025.01); *H10D 84/0151* (2025.01); *H10D 84/038* (2025.01)

(58) Field of Classification Search
CPC ............... H10D 64/017; H10D 64/021; H10D 30/6735; H10D 30/031; H10D 30/6713; H10D 84/013; H10D 84/0147; H10D 84/038; H10D 84/0151; H01L 29/66545; H01L 29/42392; H01L 29/6656; H01L 29/66742; H01L 29/78618; H01L 21/823418; H01L 21/823468; H01L 21/823481
USPC ........................................................ 257/288
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |

(Continued)

*Primary Examiner* — Tu-Tu V Ho
(74) *Attorney, Agent, or Firm* — Maschoff Brennan

(57) ABSTRACT

A method includes forming a first semiconductor layer over a substrate; forming a dummy material covering a first sidewall of the first semiconductor layer; forming source/drain epitaxy structures over the substrate and in contact with the first semiconductor layer; forming an interfacial layer on a top surface and a second sidewall of the first semiconductor layer that are uncovered by the dummy material; removing the dummy material to expose the first sidewall of the first semiconductor layer; forming a second semiconductor layer on the first sidewall of the first semiconductor layer after removing the dummy material, in which the second semiconductor layer and the source/drain epitaxy structures have different conductivity types; and forming a gate electrode over the interfacial layer.

20 Claims, 17 Drawing Sheets

(56) References Cited

U.S. PATENT DOCUMENTS

| | | |
|---|---|---|
| 9,536,738 B2 | 1/2017 | Huang et al. |
| 9,576,814 B2 | 2/2017 | Wu et al. |
| 9,608,116 B2 | 3/2017 | Ching et al. |
| 2017/0069736 A1* | 3/2017 | Lin .................. H01L 21/76224 |
| 2020/0381251 A1* | 12/2020 | Kim .................. H10D 30/6735 |

* cited by examiner

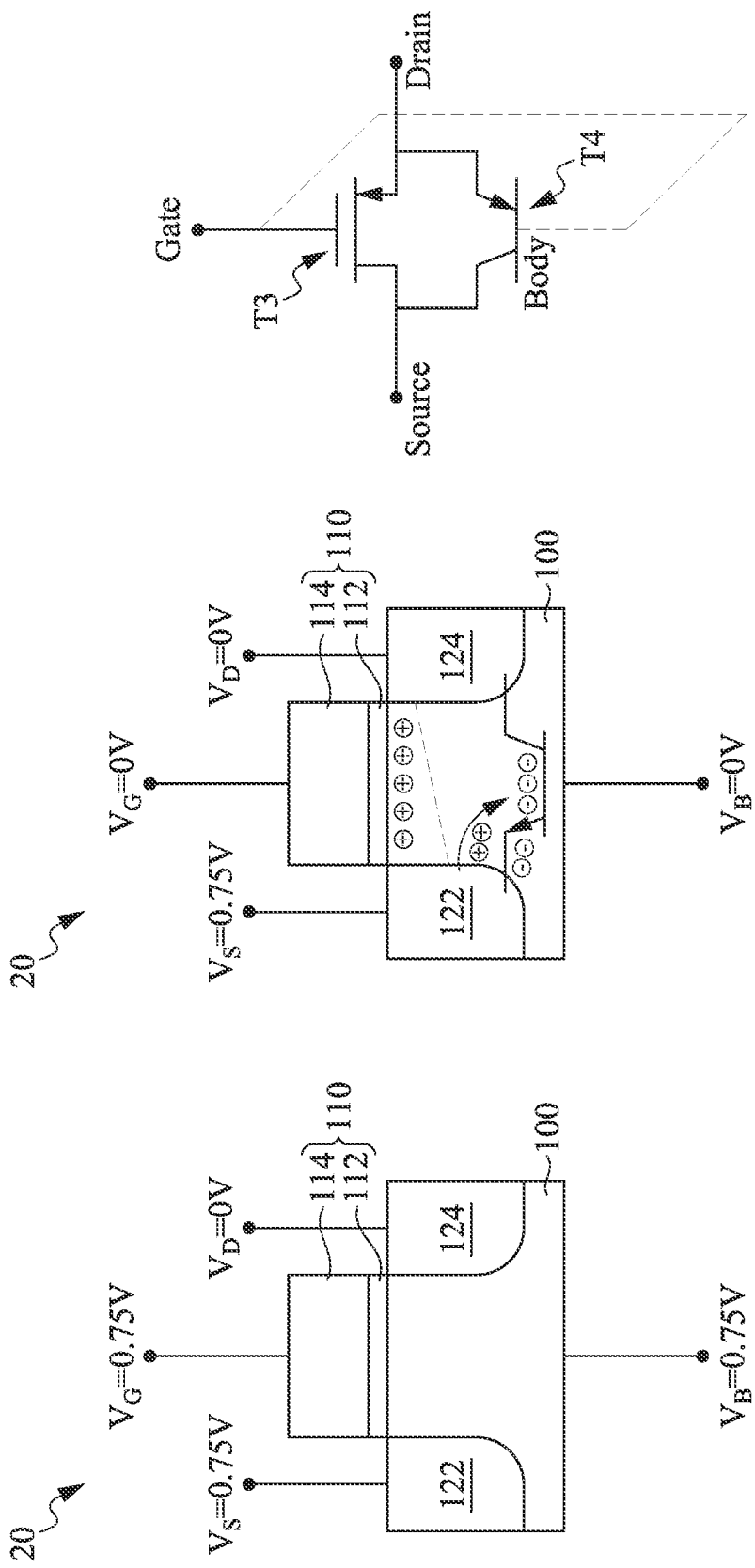

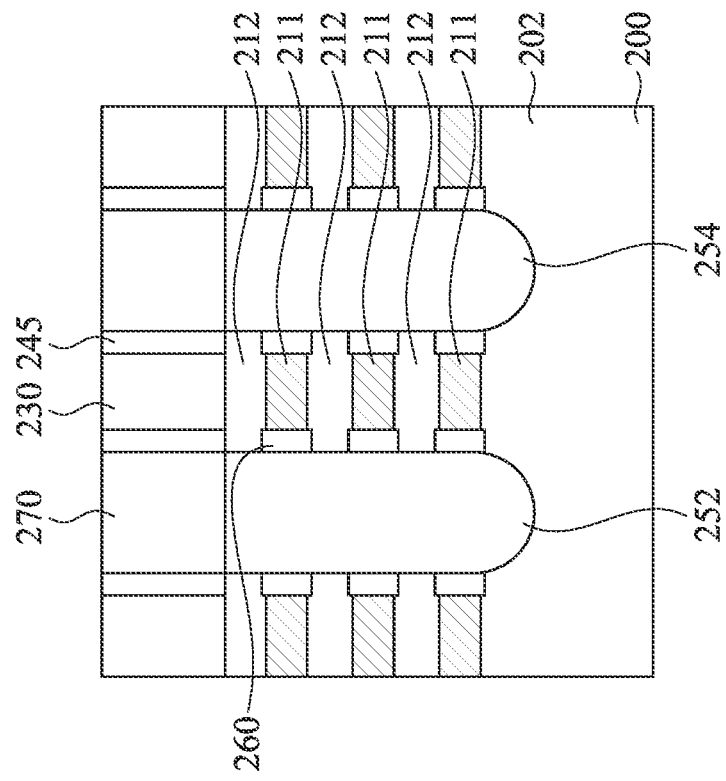
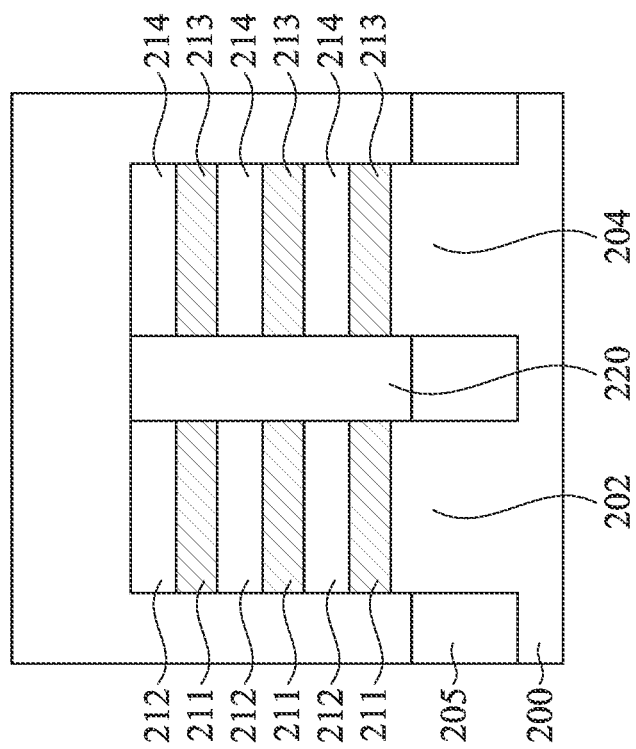
Fig. 7B
Fig. 7A

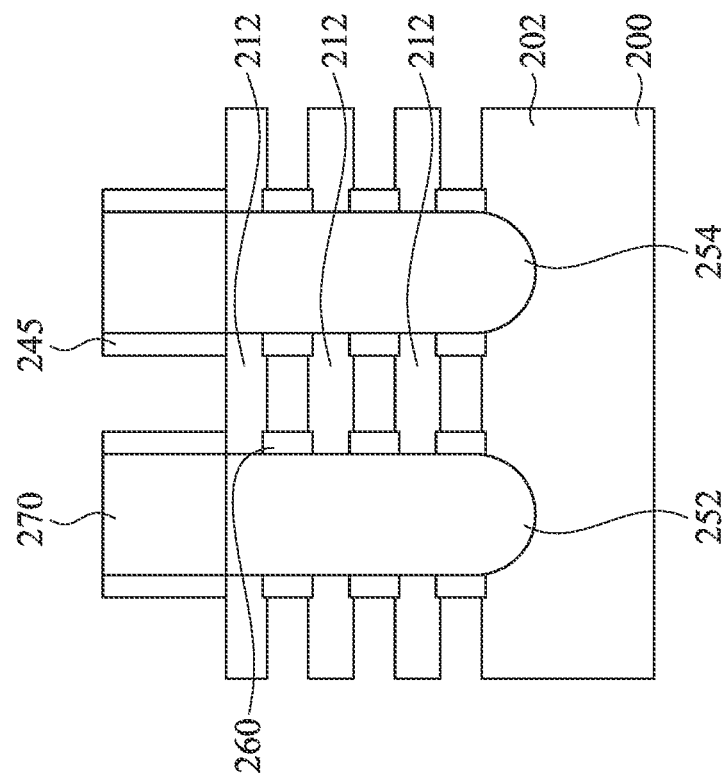
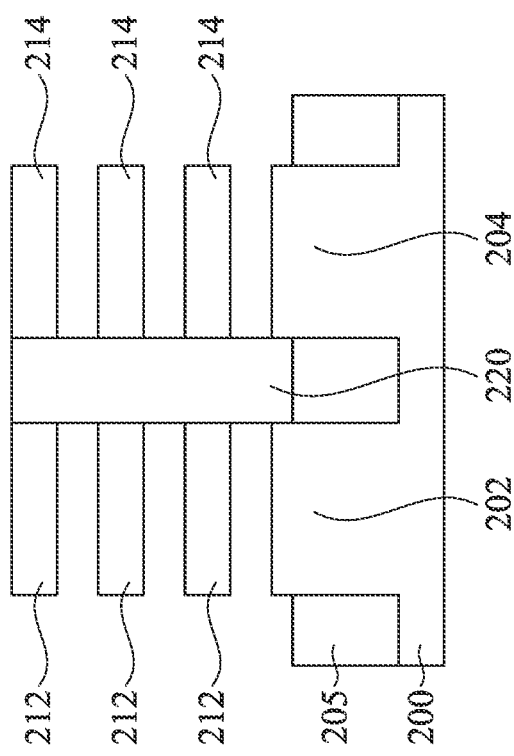
Fig. 8B
Fig. 8A

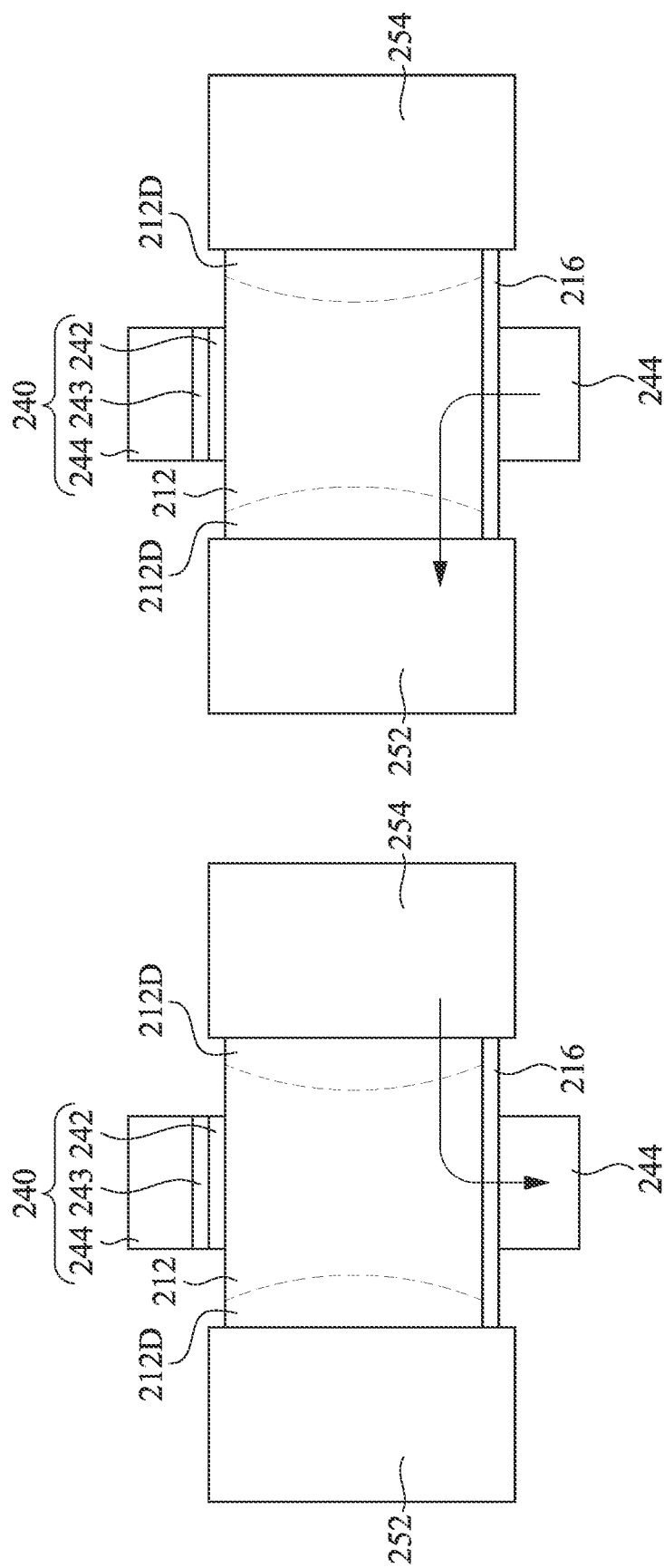

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are cross-sectional views of a semiconductor device in accordance with some embodiments of the present disclosure.

FIG. 2C is a circuit diagram of a semiconductor device in accordance with some embodiments of the present disclosure.

FIGS. 4A to 12B show various stages of a sequential manufacturing operation of an integrated circuit in accordance with some embodiments of the present disclosure.

FIGS. 13A and 13B are top views of an integrated circuit in accordance with some embodiments of the present disclosure.

DETAILED DESCRIPTION

Figure 1C:
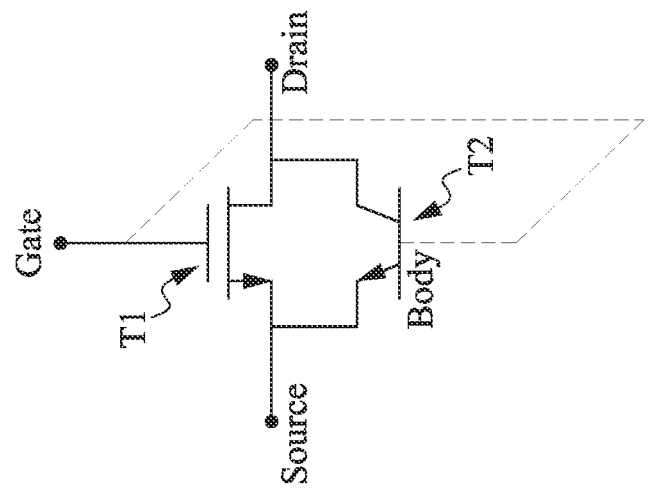
FIG. 1C is a circuit diagram of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
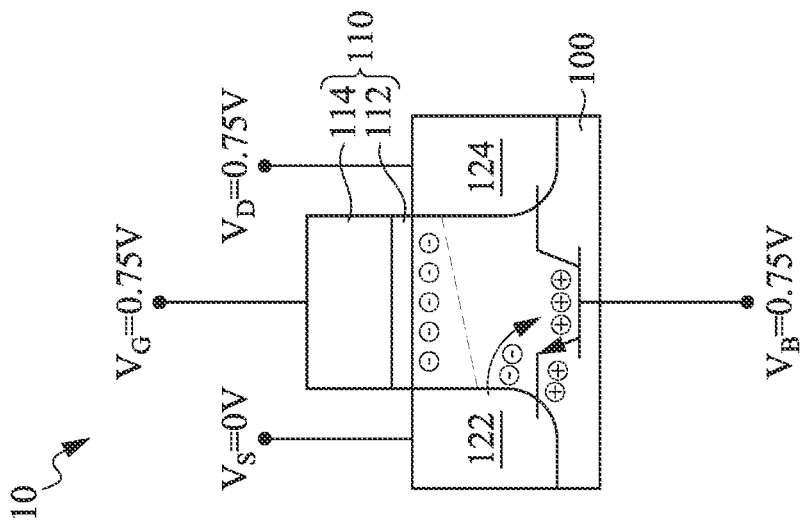
FIGS. 1A and 1B are cross-sectional views of a semiconductor device in accordance with some embodiments of the present disclosure.
Figure 1A:
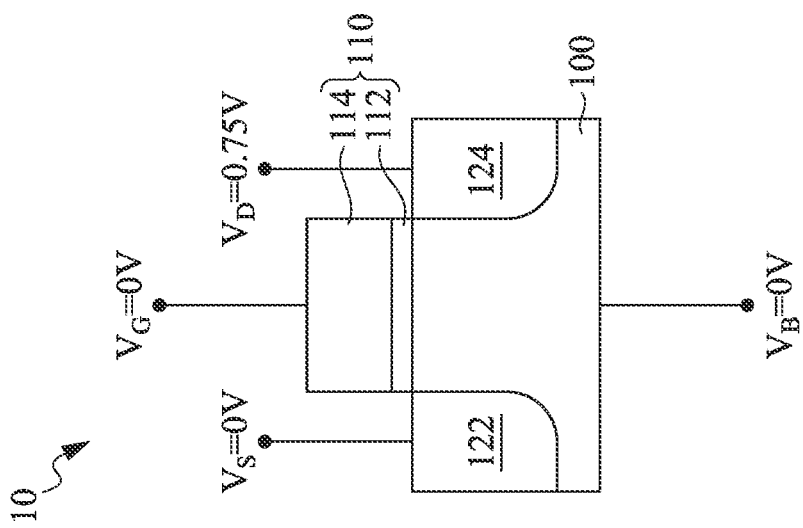

FIGS. 1A and 1B are cross-sectional views of a semiconductor device in accordance with some embodiments of the present disclosure. FIG. 1C is a circuit diagram of a semiconductor device in accordance with some embodiments of the present disclosure. In greater details, FIGS. 1A and 1B are cross-sectional views of a semiconductor device in Off-state and On-state, respectively, and FIG. 1C is an equivalent circuit diagram of the semiconductor device of FIGS. 1A and 1B.

Reference is made to FIGS. 1A and 1B. Shown there is an N-type semiconductor device 10 including a substrate 100. The substrate 100 is made of a suitable elemental crystalline semiconductor, such as silicon, diamond or germanium; a suitable alloy or compound crystalline semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. In some embodiments, crystalline silicon is used as the substrate 100. In some embodiments, the substrate 100 is a P-type substrate, which includes P-type dopants or impurities. Examples of p-type dopants can be boron (B), gallium (Ga), indium (In), aluminium (Al), or the like.

A gate structure 110 is disposed over the substrate 100. In some embodiments, the gate structure 110 includes a gate dielectric layer 112 and a gate electrode 114 over the gate dielectric layer 112. In some embodiments, the gate dielectric layer 112 includes dielectric material, such as silicon oxide (SiO$_2$), silicon nitride (SiN), silicon oxynitride (SiON), hBN, aluminum oxide (Al$_2$O$_3$), other suitable dielectric material, and/or combinations thereof. In some embodiments, the gate dielectric layer 112 may include high-k dielectric material, such as HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof.

In some embodiments, the gate electrode 114 includes a conductive material and may be selected from a group comprising of polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metals include tantalum, tungsten, titanium, aluminum, copper, molybdenum, nickel, platinum, etc.

Source/drain regions 122 and 124 are disposed over the substrate 100 and on opposite sides of the gate structure 110. In some embodiments, the source/drain regions 122 and 124 may be doped regions in the substrate 100. In some other embodiments, the source/drain regions 122 and 124 are epitaxial structures formed over the substrate 100, and may include Ge, Si, GaAs, AlGaAs, SiGe, GaAsP, SiP, or other suitable material. In some embodiments, the source/drain regions 122 and 124 include N-type dopants. Examples of N-type dopants can be phosphorus (P), arsenic (As), or antimony (Sb), or the like.

The gate structure 110, the substrate 100, and the source/drain regions 122 and 124 of FIG. 1A may collectively form a first transistor T1 (see FIG. 1C). In some embodiments, the first transistor T1 is a metal-oxide-semiconductor field effect transistor (MOSFET), and can also be referred to as a MOSFET T1 or FET T1. Here, because the first transistor T1 is an N-type device, the first transistor T1 can also be referred to as an N-FET. In some embodiments, the gate structure 110 serves as a gate of the first transistor T1, the source/drain region 122 serves as a source of the first transistor T1, and the source/drain region 124 serves as a drain of the first transistor T1. Moreover, the substrate 100 can serve as a body of the first transistor T1. Accordingly, the source/drain region 122 can be referred to as source of the first transistor T1, and the source/drain region 124 can be referred to as drain of the first transistor T1, and the substrate 100 can be to as body of the first transistor T1.

On the other hand, because the source/drain regions 122 and 124 are doped with N-type dopants, while the substrate 100 is a P-type substrate, the source/drain regions 122 and 124 and the substrate 100 form an N-P-N structure, which is a typical structure of a bipolar junction transistor (BJT). Accordingly, the source/drain regions 122 and 124 and the substrate 100 may collectively form a second transistor T2 (see FIG. 1C). Here, the second transistor T2 can be referred to as a BJT T2. In some embodiments, the source/drain region 122 serves as an emitter of the second transistor T2, and the source/drain region 124 serves as a collector of the second transistor T2, and the substrate 100 serves as a base of the second transistor T2. Accordingly, the source/drain region 122 can be referred to as emitter of the second transistor T2, and the source/drain region 124 can be referred to as collector of the second transistor T2, and the substrate 100 can be to as base of the second transistor T2. In some embodiments, the emitter region 122 have a same conductivity type as the collector region 124 but a different dopant concentration than the collector region 124, so as to act as BJT. For example, as an N-P-N type BJT structure, the emitter region 122 may have an N-type dopant concentration greater than an N-type dopant concentration of the collector region 124.

FIG. 1A illustrates that the first transistor T1 is in a first condition. In the first condition, the voltage $V_G$ applied to the gate structure 110, the voltage $V_S$ applied to the source region 122, and the voltage $V_B$ applied to the body 100 (or substrate 100) are set to a low voltage level, such as 0V. Furthermore, the voltage $V_D$ applied to the drain region 124 is set to a high voltage level. For example, the voltage $V_D$ may be 0.75. Because 0V is applied to the gate structure 110 and the source region 122 (i.e., $V_{GS}$=0V), the first transistor T1 is turn-off, and therefore the first transistor T1 is in an Off-state.

FIG. 1B illustrates that the first transistor T1 is in a second condition. In the second condition, the voltage $V_G$ applied to the gate structure 110 and the voltage $V_B$ applied to the body 100 (or substrate 100) are set to a high voltage level. For example, the voltage $V_G$ and the voltage $V_B$ are raised to about 0.75V. In some embodiments, the gate structure 110 and the body 100 (or substrate 100) may be electrically connected to each other (see FIG. 1C), or namely, connected to a same voltage level, and thus the voltage $V_G$ and the voltage $V_B$ have substantially the same voltage level. In such condition, the voltage difference between the gate structure 110 and the source region 122 may be greater than the threshold voltage $V_{TH}$ of the first transistor T1, and thus the first transistor T1 is turn-on, and therefore the first transistor T1 is in an On-state. In this situation, channel is formed at the interface between the gate structure 110 and the substrate 100, which allows carriers (i.e., electrons) flow from the source region 122 to the drain region 124. That is, drain current may flow from the drain region 124 to the source region 122.

On the other hand, with respect to the second transistor T2 formed by the regions 122, 124, and the substrate 100, because the voltage $V_B$ applied to the substrate 100 is also raised to a high voltage level, forward bias is presented at the junction between the P-type substrate 100 and the N-type region 122. In this way, majority carries (i.e., electrons in N-type region 122 or holes in P-type substrate 100) can flow through the junction formed by the P-type substrate 100 and the N-type region 122. That is, current may flow from the P-type substrate 100 to the N-type region 122 with respect to the second transistor T2.

As a result, the current caused by the second transistor T2 may contribute the drain current of the first transistor T1 under the On-state. That is to say, in the On-state of the first transistor T1, if the body 100 of the first transistor T1 is applied with a same voltage level as the voltage applied to gate structure 110 of the first transistor T1, the drain current of the first transistor T1 can be effectively increased. With such configuration, the threshold voltage of the first transistor T1 can be effectively reduced, and the first transistor can also be referred to as a dynamic threshold (DT) transistor. Accordingly, the device performance can be improved.

FIGS. 2A and 2B are cross-sectional views of a semiconductor device in accordance with some embodiments of the present disclosure. FIG. 2C is a circuit diagram of a semiconductor device in accordance with some embodiments of the present disclosure. In greater details, FIGS. 2A and 2B are cross-sectional views of a semiconductor device in Off-state and On-state, respectively, and FIG. 2C is an equivalent circuit diagram of the semiconductor device of FIGS. 2A and 2B. It is noted that some elements described in FIGS. 2A to 2C are similar to those described in FIGS. 1A to 1C, such elements are labeled the same, and relevant details will not be repeated for brevity.

FIGS. 2A and 2B are different from FIGS. 1A and 1B, in that semiconductor device 20 of FIGS. 2A and 2B is a P-type device. For example, the substrate 100 is an N-type substrate, which includes N-type dopants or impurities. Moreover, the source/drain regions 122 and 124 include P-type dopants. Examples of N-type dopants can be phosphorus (P), arsenic (As), or antimony (Sb), or the like. Examples of p-type dopants can be boron (B), gallium (Ga), indium (In), aluminium (Al), or the like.

The gate structure 110, the substrate 100, and the source/drain regions 122 and 124 of FIG. 2A may collectively form a first transistor T3 (see FIG. 1C). In some embodiments, the first transistor T3 is a metal-oxide-semiconductor field effect transistor (MOSFET), and can also be referred to as a MOSFET T3 or FET T3. Here, because the first transistor T3 is a P-type device, the first transistor T3 can also be referred to as a P-FET. In some embodiments, the gate structure 110 serves as a gate of the first transistor T3, the source/drain region 122 serves as a source of the first transistor T3, and the source/drain region 124 serves as a drain of the first transistor T3. Moreover, the substrate 100 can serve as a body of the first transistor T3. Accordingly, the source/drain region 122 can be referred to as source of the first transistor T3, and the source/drain region 124 can be referred to as drain of the first transistor T3, and the substrate 100 can be to as body of the first transistor T3.

On the other hand, because the source/drain regions 122 and 124 are doped with P-type dopants, while the substrate 100 is an N-type substrate, the source/drain regions 122 and 124 and the substrate 100 form a P-N-P structure, which is a typical structure of a bipolar junction transistor (BJT). Accordingly, the source/drain regions 122 and 124 and the substrate 100 may collectively form a second transistor T4 (see FIG. 1C). Here, the second transistor T4 can be referred to as a BJT T4. In some embodiments, the source/drain region 122 serves as a collector of the second transistor T4, and the source/drain region 124 serves as an emitter of the second transistor T4, and the substrate 100 serves as a base of the second transistor T4. Accordingly, the source/drain region 122 can be referred to as collector of the second transistor T4, and the source/drain region 124 can be referred to as emitter of the second transistor T4, and the substrate 100 can be to as base of the second transistor T4.

FIG. 2A illustrates that the first transistor T3 is in a first condition. In the first condition, the voltage $V_G$ applied to the gate structure 110, the voltage $V_S$ applied to the source region 122, and the voltage $V_B$ applied to the body 100 (or substrate 100) are applied with a high voltage level. For example, the voltages $V_G$, $V_S$, $V_B$ may be 0.75V. Furthermore, voltage $V_D$ applied to the drain region 124 is set to a low voltage level, such as 0V. Because the gate structure 110 and the source region 122 are applied with a same voltage level (i.e., $V_{GS}=0V$), the first transistor T3 is turn-off, and therefore the first transistor T3 is in an Off-state.

FIG. 2B illustrates that the first transistor T3 is in a second condition. In the second condition, the voltage $V_G$ applied to the gate structure 110 and the voltage $V_B$ applied to the body 100 (or substrate 100) are set to a low voltage level. For example, the voltage $V_G$ and the voltage $V_B$ are decreased from 0.75V (see FIG. 2A) to 0V. In some embodiments, the gate structure 110 and the body 100 (or substrate 100) may be electrically connected to each other, or namely, connected to a same voltage level, and thus the voltage $V_G$ and the voltage $V_B$ have substantially the same voltage level (see FIG. 2C). In such condition, the absolute value of voltage difference between the gate structure 110 and the source region 122 may be greater than the threshold voltage $V_TH$ of the first transistor T3, the first transistor T3 is turn-on, and therefore the first transistor T3 is in an On-state. In this situation, channel is formed at the interface between the gate structure 110 and the substrate 100, which allows carriers (i.e., holes) flow from the source region 122 to the drain region 124. That is, drain current may flow from the source region 122 to the drain region 124.

On the other hand, with respect to the second transistor T4 formed by the regions 122, 124, and the substrate 100, because the voltage $V_B$ applied to the substrate 100 is also decreased to a low voltage level, forward bias is presented at the junction between the P-type region 122 and the N-type substrate 100. In this way, majority carries (i.e., holes in P-type region 122 or electrons in N-type substrate 100) can flow through the junction formed by the P-type region 122 and the N-type substrate 100. That is, current may flow from the P-type region 122 to the N-type substrate 100 with respect to the second transistor T4.

Moreover, the current caused by the second transistor T4 may contribute the drain current of the first transistor T3 under the On-state. That is to say, in the On-state of the first transistor T3, if the body 100 of the first transistor T3 is applied with a same voltage level as the voltage applied to the gate structure 110 of first transistor T3, the drain current of the first transistor T3 can be effectively increased. In some embodiments, with such configuration, the threshold voltage of the first transistor T3 can be effectively reduced, and the first transistor T3 can also be referred to as a dynamic threshold (DT) transistor. Accordingly, the device performance can be improved.

Although FIGS. 1A to 2C use planar structure as examples, the concept of boosting current of a transistor can be applied to a gate-all-around (GAA) device. For example, in a GAA transistor, a semiconductor layer having a different conductivity type than source/drain structures can be formed on a surface of a channel region, so as to form a BJT, which in turn will improve the performance of the GAA transistor. More details will be discussed later with respect to FIGS. 3A to 14B.

Figure 3A:
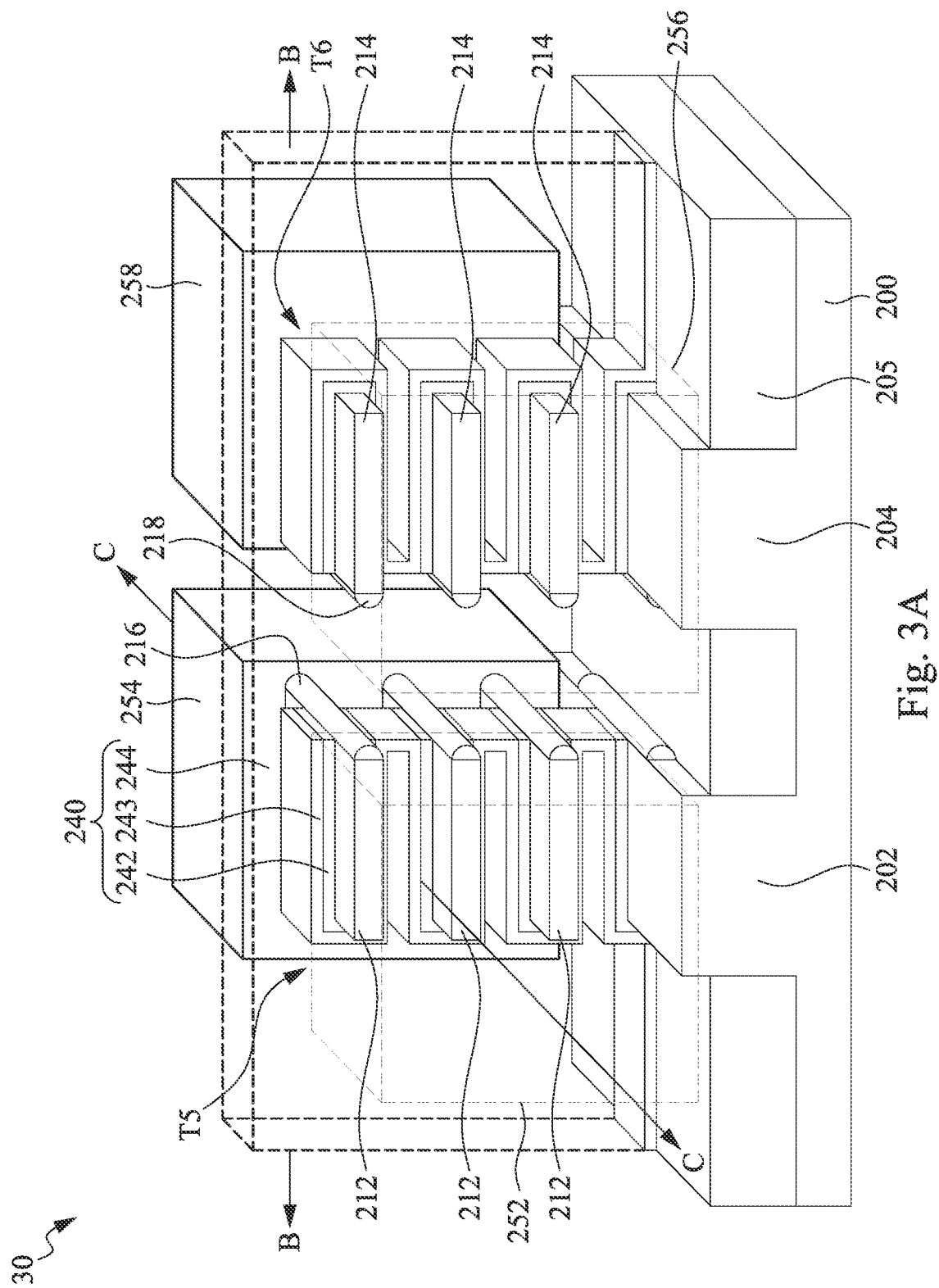
FIG. 3A is a schematic view of an integrated circuit in accordance with some embodiments of the present disclosure.
Figure 3C:
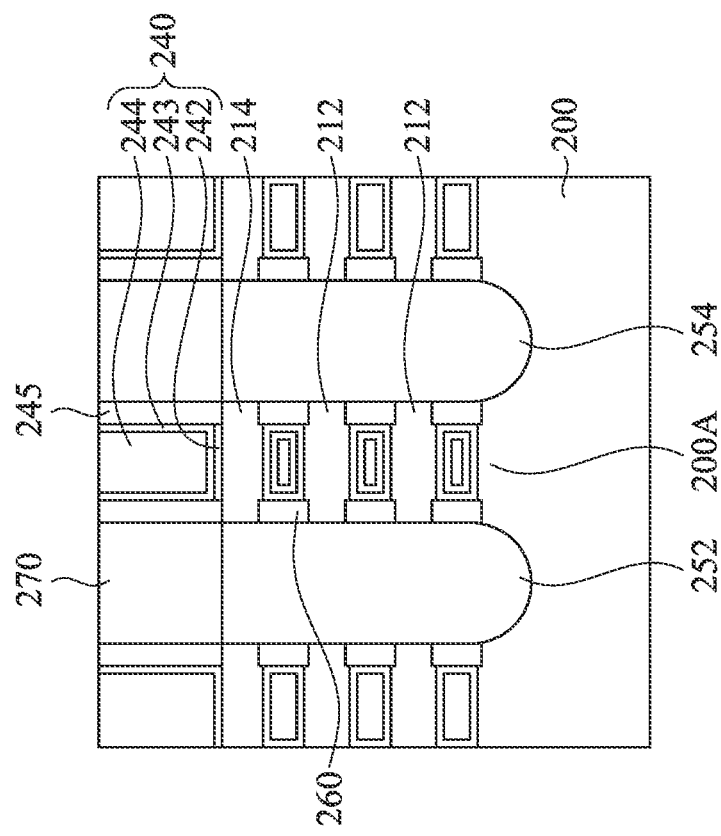
FIGS. 3B and 3C are cross-sectional views of an integrated circuit in accordance with some embodiments of the present disclosure.
Figure 3B:
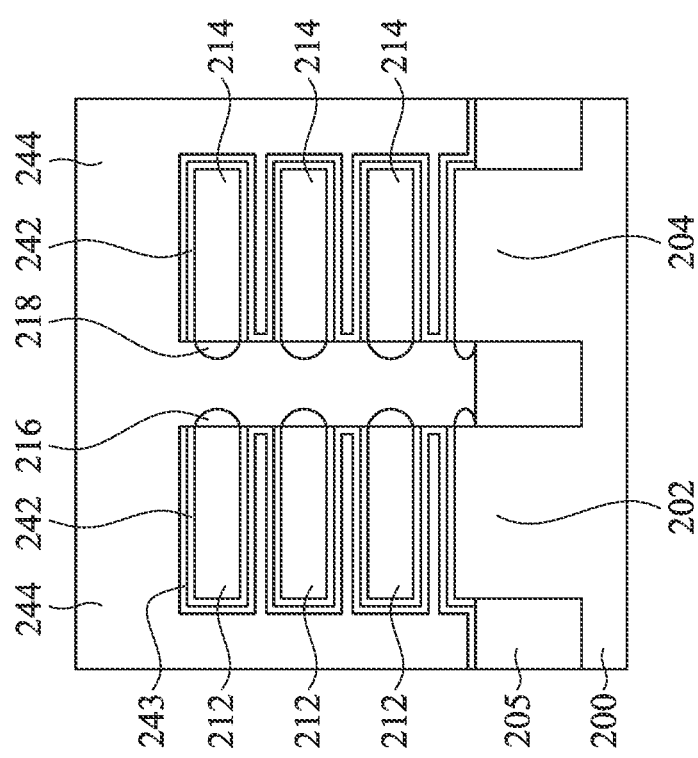
Figure 3D:
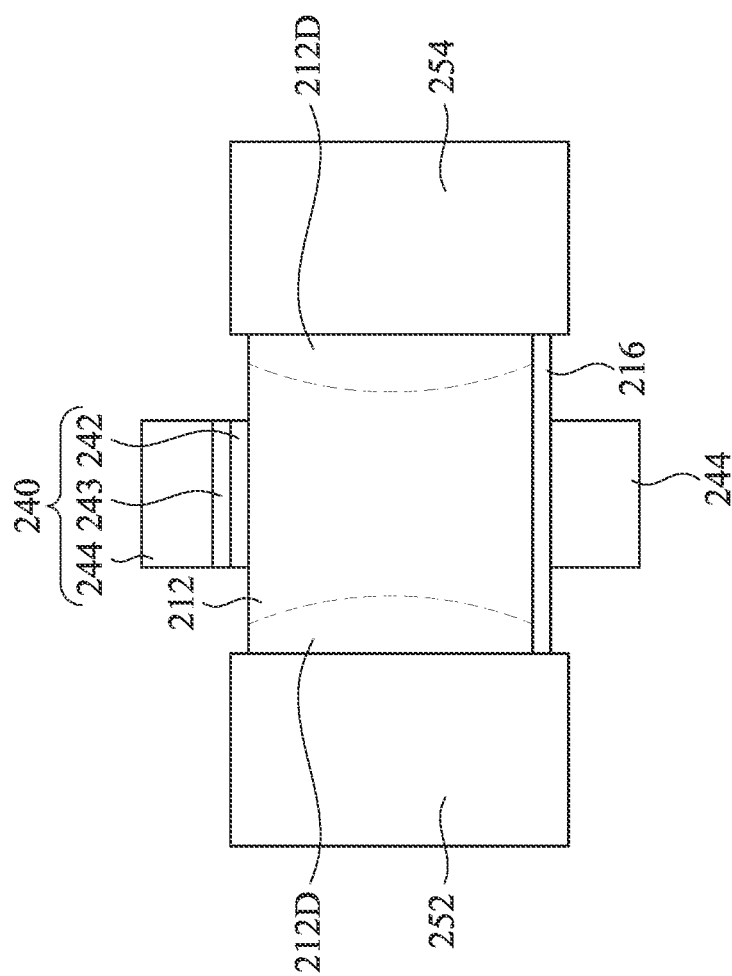
FIG. 3D is a top view of an integrated circuit in accordance with some embodiments of the present disclosure.

FIG. 3A is a schematic view of an integrated circuit in accordance with some embodiments of the present disclosure. FIGS. 3B and 3C are cross-sectional views of an integrated circuit in accordance with some embodiments of the present disclosure. FIG. 3D is a top view of an integrated circuit in accordance with some embodiments of the present disclosure. In greater details, FIGS. 3B and 3C are cross-sectional views along line B-B and line C-C of FIG. 3A, and FIG. 3D is a top view of FIG. 3A. It is noted that some elements of FIGS. 3B and 3C are not illustrated in FIG. 3A for brevity.

Reference is made to FIG. 3A. Shown there is an integrated circuit 30 including a first transistor T5 and a second transistor T6. In some embodiments, the first transistor T5 and the second transistor T6 are formed over a substrate 200.

The substrate 200 is made of a suitable elemental crystalline semiconductor, such as silicon, diamond or germanium; a suitable alloy or compound crystalline semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. In some embodiments, crystalline silicon is used as the substrate 200.

The substrate 200 includes protrusion portions 202 and 204 protruding over the top surface of the substrate 200. In some embodiments, the protrusion portions 202 and 204 are made of a same material as the substrate 200.

Reference is made to FIG. 3B. Isolation structures 205 are formed over the substrate 200 and laterally surrounding the protrusion portions 202 and 204. The isolation structures 205 may be shallow trench isolation (STI) structures, suitable isolation structures, combinations of the foregoing, or the like. In some embodiments, the isolation structures 205 may be made of oxide (e.g., silicon oxide) or nitride (e.g., silicon nitride). In some other embodiments, each of the isolation structures 205 may include a dielectric layer and a dielectric liner lining the dielectric layer, in which the dielectric liner and the dielectric layer are made of different materials, for example, the dielectric liner may be silicon nitride, and the dielectric layer may be silicon oxide.

Semiconductor layers 212 are alternately stacked over the protrusion portion 202 of the substrate 200, and semiconductor layers 214 are alternately stacked over the protrusion portion 204 of the substrate 200. In some embodiments, the semiconductor layers 212 and 214 may be made of Si, SiGe, or other suitable semiconductor materials. In some embodiments, the semiconductor layers 212 and 214 can also be referred to as nanostructures, nanowires, nanosheets, etc. In some embodiments, the semiconductor layers 212 may act as channel region of the first transistor T5, and the semiconductor layers 214 may act as channel region of the second transistor T6.

Gate structure 240 is disposed over the substrate 200 and wrapping around each of the semiconductor layers 212 and 214. In some embodiments, the gate structure 240 includes an interfacial layer 242, a gate dielectric layer 243 over the interfacial layer 242, and a gate electrode 244 over the gate dielectric layer 243. In some embodiments, the interfacial layer 242 includes dielectric material, such as silicon oxide ($SiO_2$), silicon nitride (SiN), silicon oxynitride (SiON), hBN, aluminum oxide ($Al_2O_3$), other suitable dielectric material, and/or combinations thereof. In some embodiments, the gate dielectric layer 243 may include high-k dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

In some embodiments, the gate electrode 244 includes a conductive material and may be selected from a group comprising of polycrystalline-silicon (poly-Si), poly-crystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metals include tantalum, tungsten, titanium, aluminum, copper, molybdenum, nickel, platinum, etc.

As shown in FIGS. 3A and 3B, with respect to the semiconductor layers 212 and the protrusion portion 202 of the substrate 200, the interfacial layer 242 of the gate structure 240 may cover three sides of the semiconductor layers 212. For example, in the cross-sectional view of FIG. 3B, the interfacial layer 242 of the gate structure 240 covers the top surface of the semiconductor layer 212, the bottom surface of the semiconductor layer 212, and the sidewall of the semiconductor layer 212 that is distal to the semiconductor layers 214. However, the sidewall of the semiconductor layer 212 facing the semiconductor layers 214 is free from coverage by the interfacial layer 242 of the gate structure 240. That is, in some embodiments, the interfacial layer 242 of the gate structure 240 may cover only three sides of each semiconductor layer 212.

Furthermore, the interfacial layer 242 of the gate structure 240 may cover two sides of the protrusion portion 202 of the substrate 200. For example, in the cross-sectional view of FIG. 3B, the interfacial layer 242 of the gate structure 240 covers the top surface of the protrusion portion 202 and the sidewall of the protrusion portion 202 that is distal to the semiconductor layers 214 (or protrusion portion 204). However, the sidewall of the protrusion portion 202 facing the semiconductor layers 214 (or protrusion portion 204) is free from coverage by the interfacial layer 242 of the gate structure 240. That is, in some embodiments, the interfacial layer 242 of the gate structure 240 may cover only two sides of the protrusion portion 202.

Similarly, with respect to the semiconductor layers 214 and the protrusion portion 202 of the substrate 200, the interfacial layer 242 of the gate structure 240 may cover three sides of the semiconductor layers 214. For example, in the cross-sectional view of FIG. 3B, the interfacial layer 242 of the gate structure 240 covers the top surface of the semiconductor layer 214, the bottom surface of the semiconductor layer 214, and the sidewall of the semiconductor layer 214 that is distal to the semiconductor layers 212 However, the sidewall of the semiconductor layer 214 facing the semiconductor layers 212 is free from coverage by the interfacial layer 242 of the gate structure 240. That is, in some embodiments, the interfacial layer 242 of the gate structure 240 may cover only three sides of each semiconductor layer 213.

Furthermore, the interfacial layer 242 of the gate structure 240 may cover two sides of the protrusion portion 204 of the substrate 200. For example, in the cross-sectional view of FIG. 3B, the interfacial layer 242 of the gate structure 240 covers the top surface of the protrusion portion 204 and the sidewall of the protrusion portion 204 that is distal to the semiconductor layers 212 (or protrusion portion 202). However, the sidewall of the protrusion portion 204 facing the semiconductor layers 212 (or protrusion portion 202) is free from coverage by the interfacial layer 242 of the gate structure 240. That is, in some embodiments, the interfacial layer 242 of the gate structure 240 may cover only two sides of the protrusion portion 204.

With respect to the gate dielectric layer 243, in the cross-sectional view of FIG. 3B, the gate dielectric layer 243 may continuously extend from a topmost one of the semiconductor layers 212 to a bottommost one of the semiconductor layers 212. For example, the gate dielectric layer 243 may cover surfaces of each portion of the interfacial layers 242. Moreover, the gate dielectric layer 243 may include vertical portions 243V, each vertical portion 243V extends from a portion of the interfacial layers 242 covering one of the semiconductor layers 212 to another portion of the interfacial layers 242 covering a lower one of the semiconductor layers 212.

As shown in FIGS. 3A and 3B, semiconductor layers 216 are disposed on sidewalls of the semiconductor layers 212, and semiconductor layers 218 are disposed on sidewalls of the semiconductor layers 214. In greater details, the semiconductor layers 216 are disposed on sidewalls of the semiconductor layers 212 that are uncovered by the interfacial layer 242, and the semiconductor layers 218 are disposed on sidewalls of the semiconductor layers 214 that are uncovered by the interfacial layer 242. Stated another way, the semiconductor layers 216 are disposed on sidewalls of the semiconductor layers 212 facing the semiconductor layers 214, and the semiconductor layers 218 are disposed on sidewalls of the semiconductor layers 214 facing the semiconductor layers 212.

In some embodiments, the semiconductor layers 216 are in contact with the gate electrode 244, and the semiconductor layers 216 may separate the gate electrode 244 from the semiconductor layers 212. Furthermore, the semiconductor layers 218 are in contact with the gate electrode 244, and the semiconductor layers 218 may separate the gate electrode 244 from the semiconductor layers 214.

Furthermore, one of the semiconductor layers 216 is disposed on a sidewall of the protrusion portion 202, and one of the semiconductor layers 218 is disposed on a sidewall of the protrusion portion 204. In greater details, the one of the semiconductor layers 216 is disposed on the sidewall of the protrusion portion 202 that is uncovered by the interfacial layer 242, and the one of the semiconductor layers 218 is disposed on the sidewall of the protrusion portion 204 that is uncovered by the interfacial layer 242. Stated another way, the one of the semiconductor layers 216 is disposed on the sidewall of the protrusion portion 202 facing the semiconductor layers 214 (or the protrusion portion 204), and the one of the semiconductor layers 218 is disposed on the sidewall of the protrusion portion 204 facing the semiconductor layers 212 (or the protrusion portion 202).

The semiconductor layers 216 and 218 are made of semiconductive material, such as Si, SiGe, Ge, III-V materials, or the like. In some embodiments, the semiconductor layers 216 and 218 are epitaxially formed, and thus the semiconductor layers 216 and 218 can be interchangeably referred to as epitaxy structures. The semiconductor layers 216 and 218 may be doped with P-type dopants or N-type dopants. Examples of p-type dopants can be boron (B), gallium (Ga), indium (In), aluminium (Al), or the like. Examples of N-type dopants can be phosphorus (P), arsenic (As), or antimony (Sb), or the like.

As shown in FIGS. 3A and 3C, source/drain epitaxy structures 252 and 254 are disposed over the protrusion portion 202 of the substrate 200 and on opposite sides of the gate structure 240, and source/drain epitaxy structures 256 and 258 are disposed over the protrusion portion 204 of the substrate 200 and on opposite sides of the gate structure 240.

As shown in the cross-sectional view of FIG. 3C, in a direction perpendicular to the lengthwise direction of the gate structure 240, the source/drain epitaxy structures 252 and 254 may be in contact with opposite sidewalls of each of the semiconductor layers 212. Similarly, in a direction perpendicular to the lengthwise direction of the gate structure 240, the source/drain epitaxy structures 256 and 258 may be in contact with opposite sides of each of the semiconductor layers 214.

In some embodiments, the source/drain epitaxy structures 252, 254, 256 and 258 may include Si, SiGe, Ge, III-V materials, or the like. In some embodiments, the source/drain epitaxy structures 252, 254, 256 and 258 may include epitaxial material for N-type device (e.g., NFET), such as SiP, SiAs, SiC, or the like. On the other hand, the source/drain epitaxy structures 252, 254, 256 and 258 may include epitaxial material for P-type device (e.g., PFET), such as SiGeB, SiCB, or the like. The source/drain epitaxy structures 252, 254, 256 and 258 may be doped with P-type dopants or N-type dopants. Examples of p-type dopants can be boron (B), gallium (Ga), indium (In), aluminium (Al), or the like. Examples of N-type dopants can be phosphorus (P), arsenic (As), or antimony (Sb), or the like.

The semiconductor layers 212, the source/drain epitaxy structures 252 and 254, and the gate structure 240 may collectively form the first transistor T5 as shown in FIG. 3A. On the other hand, the semiconductor layers 214, the source/drain epitaxy structures 256 and 258, and the gate structure 240 may collectively form the second transistor T6 as shown in FIG. 3A.

In some embodiments, the first transistor T5 and the second transistor T6 may include the same conductivity type. For example, the first transistor T5 and the second transistor T6 may be both N-type devices (NFET) or may be both P-type devices (PFET). In such condition, the source/drain epitaxy structures 252 and 254 may include a same conductivity type as the source/drain epitaxy structures 256 and 258. For example, when the first transistor T5 and the second transistor T6 are both N-type devices (NFET), the source/drain epitaxy structures 252, 254, 256 and 258 may be doped with N-type dopants and/or include epitaxial materials for N-type device. Similar, when the first transistor T5 and the second transistor T6 are both P-type devices (PFET), the source/drain epitaxy structures 252, 254, 256 and 258 may be doped with P-type dopants and/or include epitaxial materials for P-type device.

In some other embodiments, the first transistor T5 and the second transistor T6 may include different conductivity types (or opposite conductivity types). For example, if the first transistor T5 is an N-type device (NFET), the second transistor T6 is therefore a P-type device (PFET), and vice versa. In such condition, the source/drain epitaxy structures 252 and 254 may include a different conductivity type than the source/drain epitaxy structures 256 and 258. For example, if the first transistor T5 and the second transistor T6 are N-type device and P-type device, respectively, the source/drain epitaxy structures 252 and 254 may be doped with N-type dopants and/or include epitaxial materials for N-type device, while the source/drain epitaxy structures 256 and 258 may be doped with P-type dopants and/or include epitaxial materials for P-type device. Similarly, if the first transistor T5 and the second transistor T6 are P-type device and N-type device, respectively, the source/drain epitaxy structures 252 and 254 may be doped with P-type dopants and/or include epitaxial materials for P-type device, while the source/drain epitaxy structures 256 and 258 may be doped with N-type dopants and/or include epitaxial materials for N-type device.

In some embodiments, the source/drain epitaxy structures 252 and 254 may include different conductivity types than the semiconductor layers 216. For example, if the source/drain epitaxy structures 252 and 254 are N-doped (or P-doped), the semiconductor layers 216 are then P-doped (or N-doped). Similarly, if the source/drain epitaxy structures 256 and 258 are N-doped (or P-doped), the semiconductor layers 218 are then P-doped (or N-doped). As a result, the source/drain epitaxy structures 252 and 254, the semiconductor layers 212, and the semiconductor layers 216 may collectively form a first bipolar junction transistor (BJT). On the other hand, the source/drain epitaxy structures 256 and 258, the semiconductor layers 214, and the semiconductor layers 218 may collectively form a second BJT.

Reference is made to FIG. 3D. FIG. 3D is a top view of one semiconductor layer 212, the source/drain epitaxy structures 252 and 254, the semiconductor layer 216, and the gate structure 240. It is noted that the structural relationship among of the semiconductor layer 214, the source/drain epitaxy structures 256 and 258, the semiconductor layer 218, and the gate structure 240 may be similar to that described in FIG. 3D, and thus relevant details will not be repeated for brevity.

The semiconductor layer 212 may be intrinsic semiconductor material (un-doped or negligibly doped). Accordingly, the dopant concentration of the semiconductor layer 212 may be lower than the dopant concentration of the source/drain epitaxy structures 252 and 254, and may be lower than the dopant concentration of the semiconductor layer 216. In some embodiments, the semiconductor layer 212 may include doped regions 212D on opposite ends of the semiconductor layer 212, in which the doped regions 212D may be in contact with the source/drain epitaxy structures 252 and 254. This is due to diffusion of dopants from the source/drain epitaxy structures 252 and 254. Accordingly, the doped regions 212D of the semiconductor layer 212 may include a same conductivity type as the source/drain epitaxy structures 252 and 254, and may include a different conductivity type than the semiconductor layer 216.

In some embodiments, the semiconductor layer 216 is wider than the interfacial layer 242, the gate dielectric layer 243, and the gate electrode 244 from the top view of FIG. 3D. Stated another way, in a direction perpendicular to the lengthwise direction of the gate structure 240, the semiconductor layer 216 is wider than the interfacial layer 242.

In some embodiments, the semiconductor layer 216 may be in contact with the source/drain epitaxy structures 252 and 254, so as to form the first BJT. However, in some other embodiments, the semiconductor layer 216 may not be in contact with the source/drain epitaxy structures 252 and 254. In such configuration, the semiconductor layer 216 may be electrically connected to the source/drain epitaxy structures 252 and 254 through the doped regions 212D in the semiconductor layer 212, so as to form the first BJT.

Based on the concept as discussed in FIGS. 1A to 2C, embodiments of the present disclosure provides a structure by forming the semiconductor layer 216 on a sidewall of the semiconductor channel layer 212 of the first transistor T5. The semiconductor layer 216 has a different conductivity type than the source/drain epitaxy structures 252 and 254 of the first transistor T1, which will effectively form a BJT. As a result, the source/drain epitaxy structures 252 and 254 can serve as collector and emitter of the BJT (or emitter and collector of the BJT), and the semiconductor layer 216 can serve as a base of the BJT. Furthermore, the gate electrode 244 of the gate structure 240 is in direct contact with the semiconductor layer 216, which ensures that the gate structure 240 of the first transistor T5 and the base of the BJT (semiconductor layer 216) are applied with a same voltage level. For the reasons as discussed above with respect to FIGS. 1A to 2C, such configuration will effectively increase the current of the first transistor T5 in an On-state, and will effectively reduce the threshold voltage of the first transistor T5. Similarly, by forming the semiconductor layer 218 on a sidewall of the semiconductor channel layer 214 of the second transistor T6, the performance of the second transistor T6 can be improved as well.

Referring back to FIG. 3C, FIG. 3C is a cross-sectional view along the semiconductor layer 212, the source/drain epitaxy structures 252 and 254, and the gate structure 240. It is noted that the structural relationship among of the semiconductor layer 214, the source/drain epitaxy structures 256 and 258, and the gate structure 240 may be similar to that described in FIG. 3C, and thus relevant details will not be repeated for brevity.

Gate spacers 245 are disposed on opposite sidewalls of top portion of the gate structure 240. In some embodiments, the gate spacers 150 may be formed by insulating dielectric material, such as a silicon nitride-based material. Examples of the silicon nitride-based material can be SiN, SiON, SiOCN or SiCN and combinations thereof.

Inner spacers 260 are disposed on opposite sidewalls of lower portion of the gate structure 240. Moreover, the inner spacers 260 are vertically interposing two adjacent semiconductor layers 212. The inner spacers 260 may be in contact with the source/drain epitaxy structures 252 and 256. In some embodiments, the inner spacers 260 may be formed by insulating dielectric material, such as a silicon nitride-based material. Examples of the silicon nitride-based material can be SiN, SiON, SiOCN or SiCN and combinations thereof.

An interlayer dielectric (ILD) layer 270 is disposed over the source/drain epitaxy structures 252 and 256, and laterally surrounds the gate structure 240. In some embodiments, the ILD layer 270 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

FIGS. 4A to 12B show various stages of a sequential manufacturing operation of an integrated circuit in accordance with some embodiments of the present disclosure. In greater details, FIGS. 4A, 5A, 6A, 7A, 8A, 9A, 10A, 11A, and 12A have a same cross-sectional view as the cross-sectional view of FIG. 3B. FIGS. 4B, 5B, 6B, 7B, 8B, 9B, 10B, 11B, and 12B have a same cross-sectional view as the cross-sectional view of FIG. 3C. It is noted that some elements discussed in FIGS. 4A to 12B have been discussed in FIGS. 3A to 3D, such elements are labeled the same, and relevant details will not be repeated for brevity.

Figure 4B:
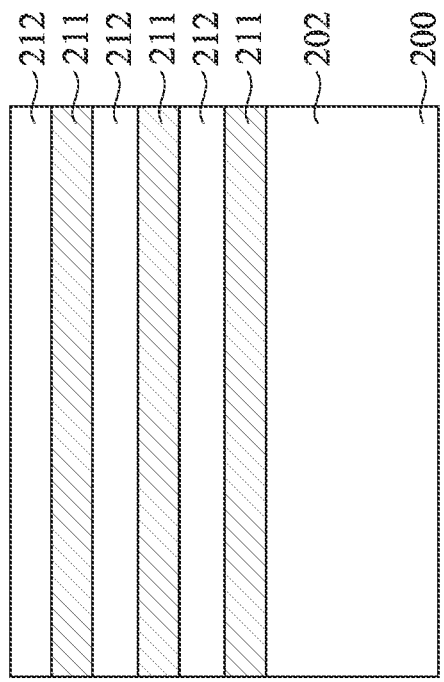
Figure 4A:
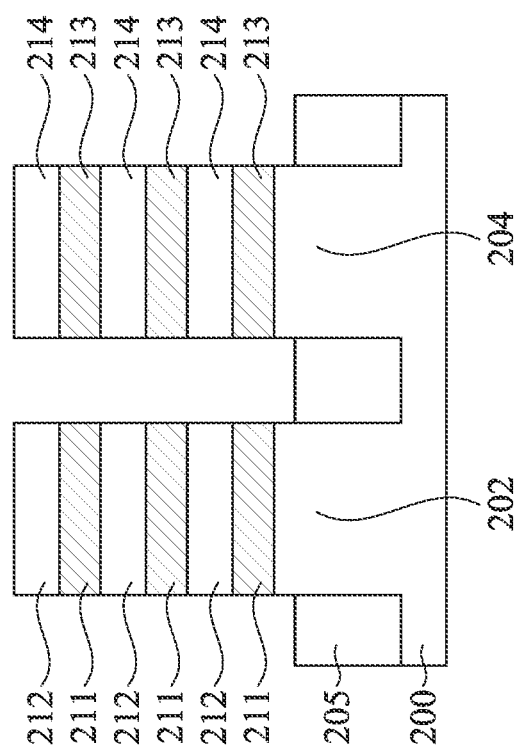

Reference is made to FIGS. 4A and 4B. Shown there is a substrate 200. The substrate 200 includes protrusion portions 202 and 204. Semiconductor layers 211 and 212 are alternately stacked over the protrusion portion 202, and semiconductor layers 213 and 214 are alternately stacked over the protrusion portion 204, respectively. In some embodiments, the protrusion portions 202 and 204, and semiconductor layers 211, 212, 213, 214 can be formed by, for example, alternately depositing a first material of the semiconductor layers 211, 213 and a second material of the semiconductor layers 212, 214 over the substrate 200, and performing a patterning process to the first materials, the second materials, and the substrate 200. In some embodiments, the semiconductor layers 211, 213, and the protrusion portion 202 can be collectively referred to as a fin structure, and the semiconductor layers 213, 214, and the protrusion portion 204 can be collectively referred to as a fin structure.

The semiconductor layers 211, 213 and the semiconductor layers 212, 214 have different materials and/or components, such that the semiconductor layers 211, 213 and the semiconductor layers 212, 214 have different etching rates. In some embodiments, the semiconductor layers 211, 213 are made from SiGe. The germanium percentage (atomic percentage concentration) of the semiconductor layers 211, 213 is in the range between about 10 percent and about 20 percent, while higher or lower germanium percentages may be used. It is appreciated, however, that the values recited throughout the description are examples, and may be changed to different values. For example, the semiconductor layers 211, 213 may be $Si_{0.8}Ge_{0.2}$ or $Si_{0.9}Ge_{0.1}$, in which the proportion between Si and Ge may vary from embodiments, and the disclosure is not limited thereto. The semiconductor layers 212, 214 may be pure silicon layers that are free of germanium. The semiconductor layers 212, 214 may also be substantially pure silicon layers, for example, with a germanium percentage lower than about 1 percent. In some embodiments, the semiconductor layers 211, 213 have a higher germanium atomic percentage concentration than the semiconductor layers 212, 214. The semiconductor layers 103 and 104 may be formed by chemical vapor deposition (CVD), molecular beam epitaxy (MBE), or other suitable process(es). In some embodiments, the semiconductor layers 211, 212, 213, and 214 are formed by an epitaxy growth process, and thus the semiconductor layers 211, 212, 213, and 214 can also be referred to as epitaxial layers in this content.

Isolation structures 205 are formed over the substrate 200 and laterally surrounding the protrusion portions 202 and 204 of the substrate 200. The isolation structures 205 can be formed by, for example, depositing a dielectric material blanket over the substrate 200, performing a chemical mechanism polishing (CMP) process, and then performing an etching back process to the dielectric material.

Figure 5B:
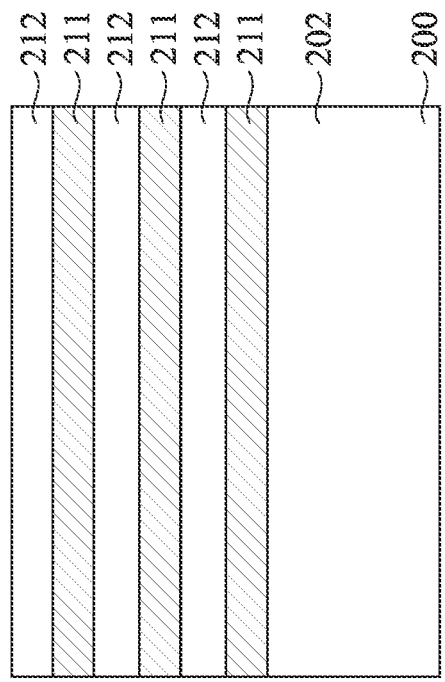
Figure 5A:
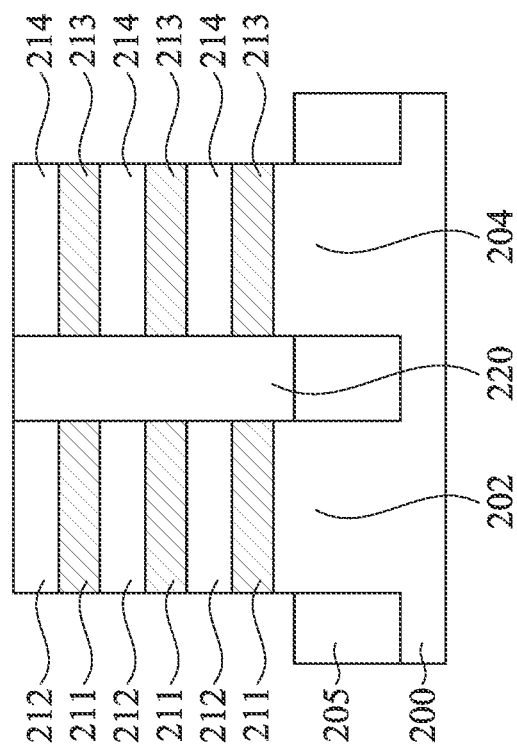

Reference is made to FIGS. 5A and 5B. A dummy material 220 is formed over the substrate 200. In greater details, the dummy material 220 is formed in a position between the protrusion portions 202 and 204. Moreover, the dummy material 220 is formed in a position between the semiconductor layers 211, 212 and the semiconductor layers 213, 214. In some embodiments, the dummy material 220 is in contact with one sidewall of the protrusion portion 202, one sidewall of the protrusion portion 204, one sidewall of each semiconductor layer 211, one sidewall of each semiconductor layer 212, one sidewall of each semiconductor layer 213, and one sidewall of each semiconductor layer 214. That is, other sidewalls of the protrusion portions 202, 204 and the semiconductor layers 211, 212, 213, and 214 are free from coverage by the dummy material 220. The dummy material 220 may be removed in following steps as will be discussed later, and thus the dummy material 220 can also be referred to as a sacrificial structure.

The dummy material 220 may include dielectric material, such as dielectric material, such as silicon oxide ($SiO_2$), silicon nitride (SiN), silicon oxynitride (SiON), or the like. In some embodiments, the dummy material 220 and the isolation structures 205 are made of different materials to provide etching selectivity. The dummy material 220 can be formed by, for example, depositing a dielectric material blanket over the substrate 200, performing a CMP process to remove excess dielectric material until topmost semiconductor layers 212 and 214 are exposed, and then patterning the dielectric material by removing unwanted portions of the dielectric material. The remaining dielectric material can be referred to as the dummy material 220.

Figure 6B:
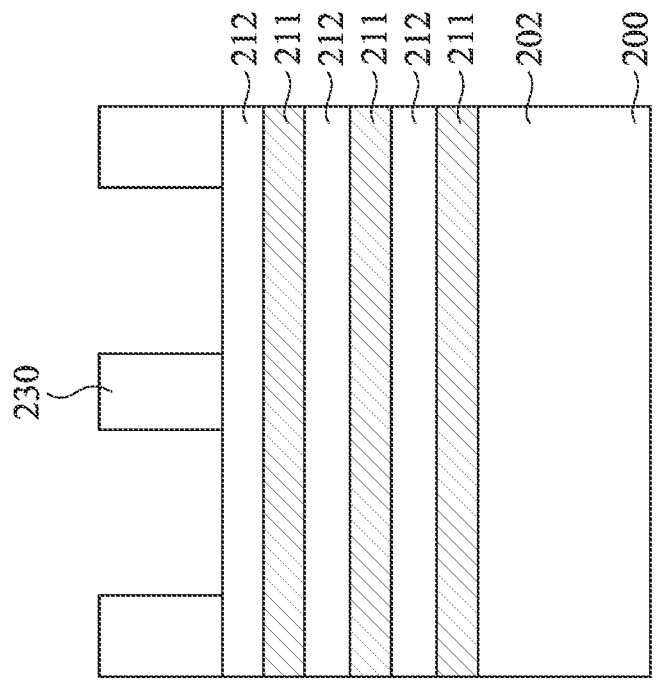
Figure 6A:
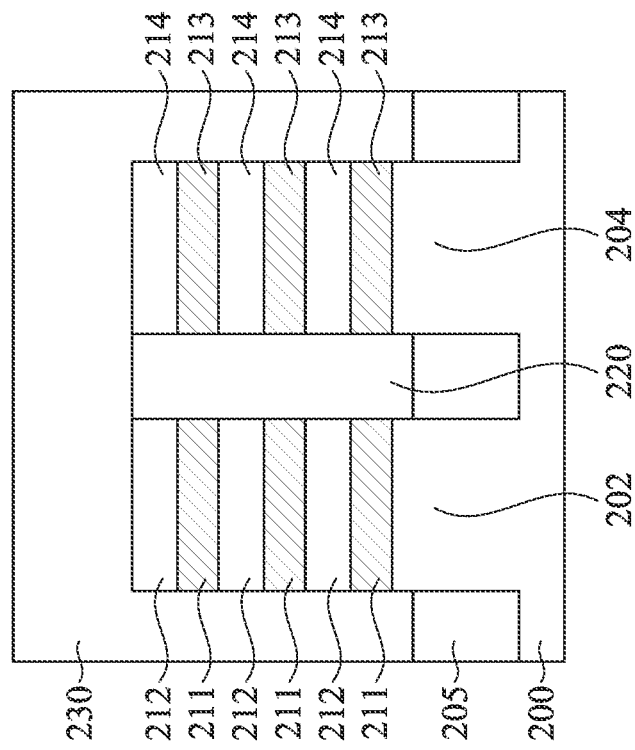

Reference is made to FIGS. 6A and 6B. Dummy gate structure 230 is formed over the substrate 200. In the cross-sectional view of FIG. 6A, the dummy gate structure 230 is formed over the semiconductor layers 211, 212, 213, and 214. In some embodiments, the sidewalls of the semiconductor layers 211, 212, 213, and 214 and the sidewalls of the protrusion portions 202 and 204 that are covered by the dummy material 220 is separated from the dummy gate structure 230. The dummy gate structure 230 may be in contact with the top surface of the dummy material 220.

In some embodiments, the dummy gate structure 230 may include a gate dielectric layer and a gate electrode over the gate dielectric layer. In some embodiments, the gate dielectric layer may be, for example, silicon oxide, silicon nitride, a combination thereof, or the like, and may be deposited or thermally grown according to acceptable techniques. The gate dielectric layer may be formed by a suitable process, such as chemical vapor deposition (CVD), physical vapor deposition (PVD), atomic layer deposition (ALD), or any suitable process. The gate electrode may include polycrystalline-silicon (poly-Si) or poly-crystalline silicon-germanium (poly-SiGe). Further, the gate electrode may be doped poly-silicon with uniform or non-uniform doping. The gate electrode may be formed by a suitable process, such as chemical vapor deposition (CVD), physical vapor deposition (PVD), atomic layer deposition (ALD), or any suitable process.

Reference is made to FIGS. 7A and 7B. Gate spacers 245 are formed on opposite sidewalls of the dummy gate structure 230 (see FIG. 7B). The gate spacers 245 may be formed by, for example, depositing a spacer material blanket over the dummy gate structure 230, and subsequently performing an etching process to remove horizontal portions of the spacer material, such that vertical portions of the spacer material remain on sidewalls of the dummy gate structure 230.

As shown in FIG. 7B, the portions of semiconductor layers 211 and 212 uncovered by the dummy gate structure 230 and the gate spacers 245 are recessed to form recesses that expose sidewalls of the semiconductor layers 211 and 212. Next, the semiconductor layers 211 are laterally trimmed. Then, inner spacers 260 are formed on opposite sides of the semiconductor layers 211 and are vertically between the semiconductor layers 212.

After the inner spacers 260 are formed, source/drain epitaxy structures 252 and 254 are formed over the substrate 200. In some embodiments, the source/drain epitaxy structures 252 and 254 may be formed by selective epitaxial growth (SEG). Although not shown, the semiconductor layers 213 and 214 may undergo a same process as described above, and epitaxy source/drain structures 256 and 258 (see FIG. 3A) may also be formed.

An interlayer dielectric (ILD) layer 270 is formed over the epitaxy structures 252 and 254 (and source/drain epitaxy structures 256 and 258, see FIG. 3A) and laterally surrounding the dummy gate structures 230. In some embodiments, the ILD layer 270 may be formed by, for example, depositing an ILD material layer over the substrate 200 and subsequently performing a CMP process to remove the excess ILD material layer until the top surface of the dummy gate structure 230 is exposed.

Reference is made to FIGS. 8A and 8B. The dummy gate structure 230, the semiconductor layers 211, and the semiconductor layers 213 are removed to form gate trenches. As a result, surfaces of the semiconductor layers 212, 214 and the protrusion portions 202, 204 are exposed. In some embodiments, the dummy gate structure 230, the semiconductor layers 211, and the semiconductor layers 213 may be removed by a suitable process, such as wet etch, dry etch, or combinations thereof.

Figure 9B:
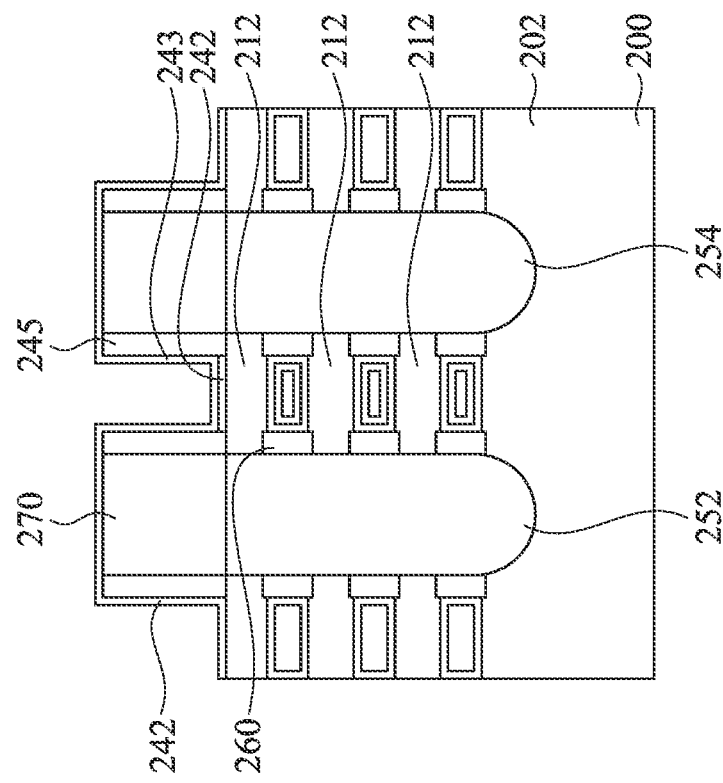
Figure 9A:
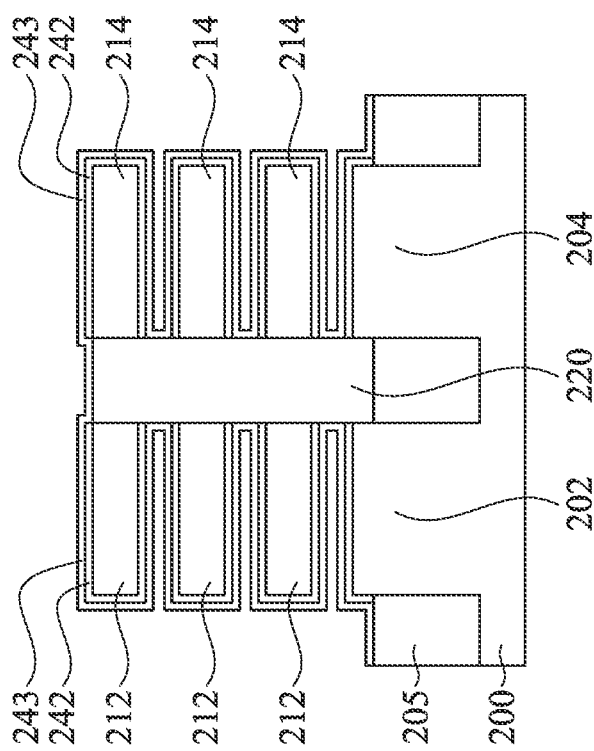

Reference is made to FIGS. 9A and 9B. An interfacial layer 242 is formed on exposed surfaces of the semiconductor layers 212, 214 and the protrusion portions 202, 204. The interfacial layer 242 may be selectively formed on exposed surfaces of the semiconductor layers 212, 214 and the protrusion portions 202, 204. In some embodiments, the interfacial layer 242 may not be formed on exposed surfaces of the dummy material 220 and the isolation structure 205. In some embodiments, the interfacial layer 242 may be formed by thermal oxidation.

Afterward, a gate dielectric layer 243 is formed over the interfacial layer 242. In some embodiments, the gate dielectric layer 243 may be deposited in a conformal manner, such that the gate dielectric layer 243 may not only extend over surfaces of the interfacial layer 242, but also the surfaces of the dummy material 220 and the isolation structures 205. In greater details, in the cross-sectional view of FIG. 9A, the gate dielectric layer 243 may be in contact with opposite sidewalls and top surface of the dummy material 220. In some embodiments, the dielectric layer 243 may be formed by, CVD, ALD, or other suitable deposition process.

Figure 10B:
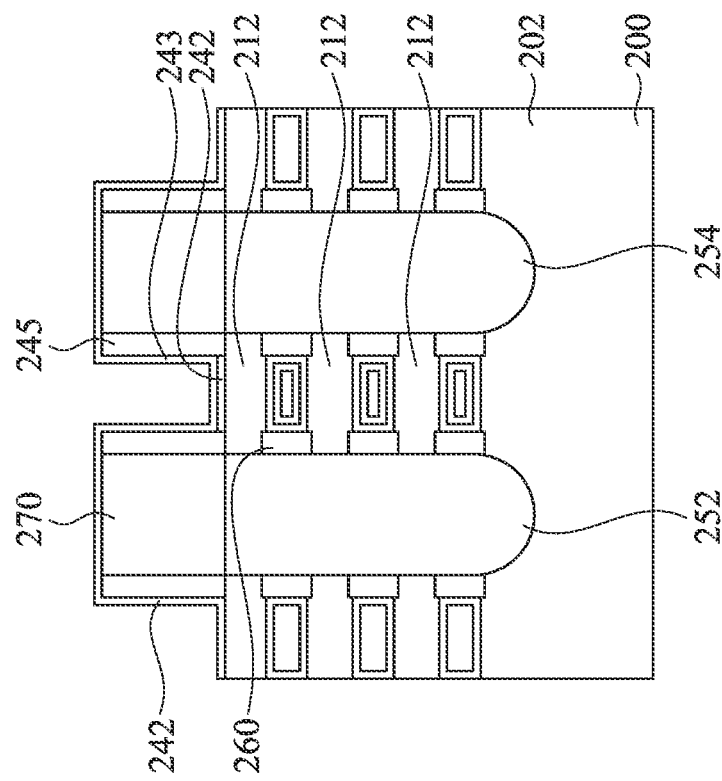
Figure 10A:
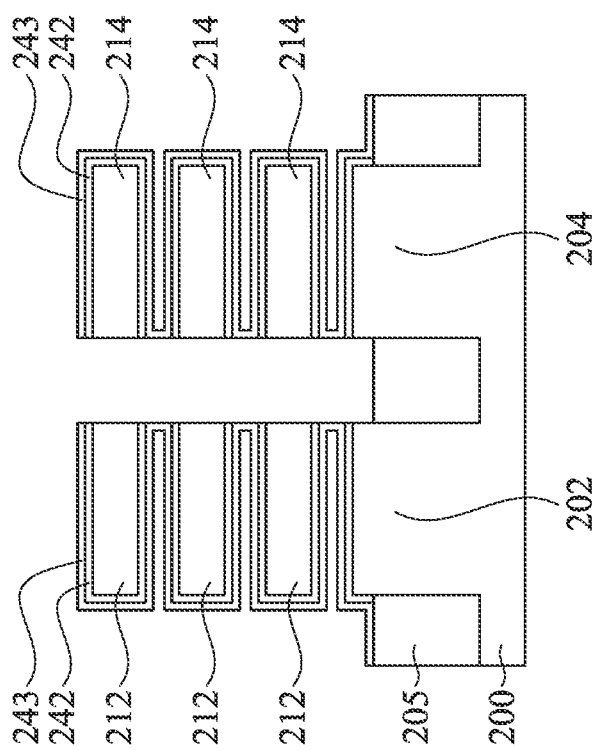

Reference is made to FIGS. 10A and 10B. The dummy material 220 is removed. In some embodiments, a pattern mask (e.g., a photoresist) may be deposited over the structure shown in FIGS. 9A and 9B, in which the pattern mask may include an opening that vertically align with the dummy material 220. An etching process may be performed to remove the dummy material 220 through the opening of the pattern mask, so as to expose sidewalls of the semiconductor layers 212 and 214. In some embodiments, a portion of the dielectric layer 243 over the top surface of the dummy material 220 may also be removed as a result of the etching process. After the dummy material 220 is removed, the pattern mask is then removed. In some embodiments, the dummy material 220 may be removed by dry etch, wet etch, or combinations thereof.

Figure 11B:
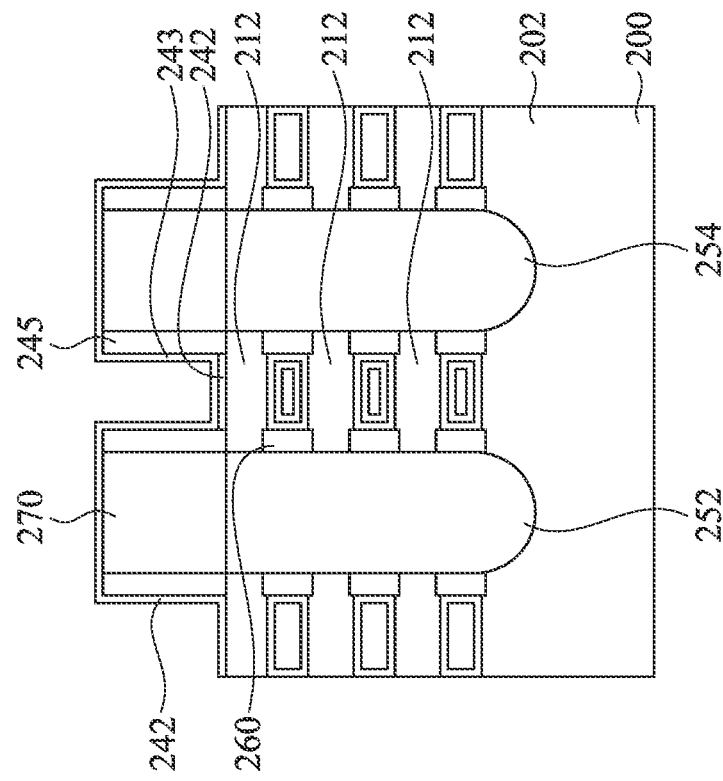
Figure 11A:
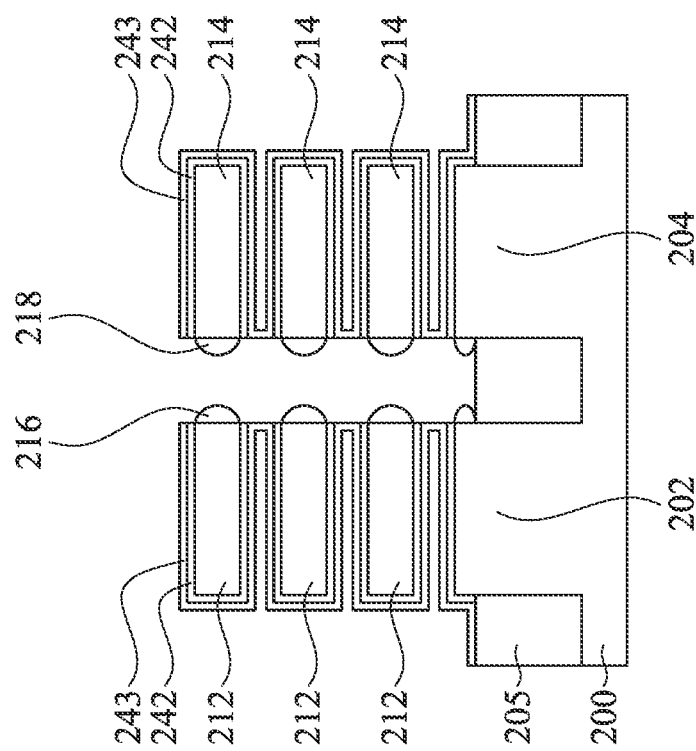

Reference is made to FIGS. 11A and 11B. Semiconductor layers 216 and 218 are formed on exposed surfaces of the semiconductor layers 212 and 214 that are uncovered by the interfacial layer 242. In some embodiments, the semiconductor layers 216 and 218 are selectively formed on the exposed surfaces of the semiconductor layers 212 and 214. That is, the formation rate of the semiconductor layers 216 and 218 are higher on the exposed surfaces of the semiconductor layers 212 and 214 than on the interfacial layer 242 and/or the gate dielectric layer 243. In some embodiments, the semiconductor layers 216 and 218 are formed by selective epitaxial growth (SEG).

Figure 12B:
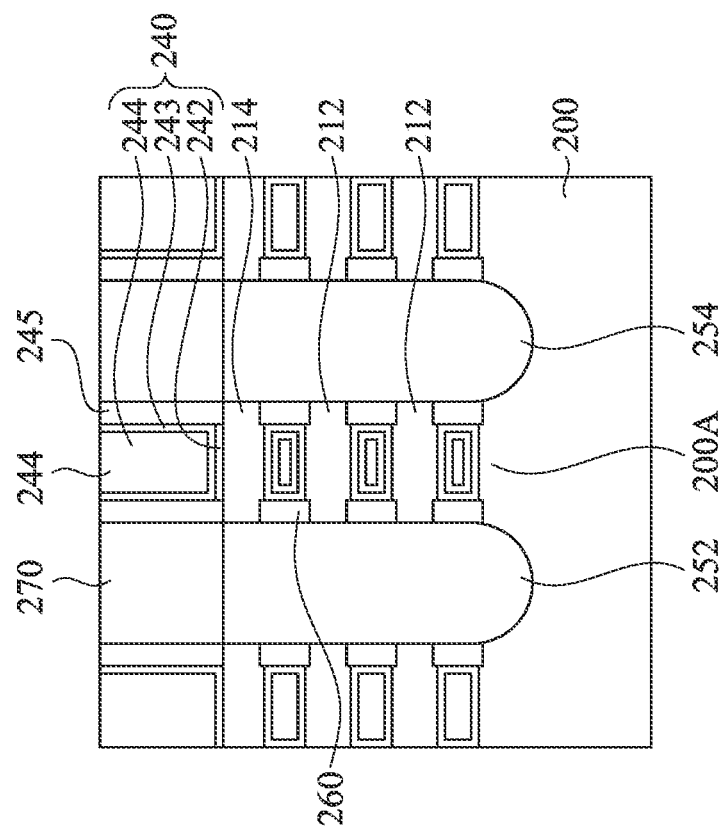
Figure 12A:
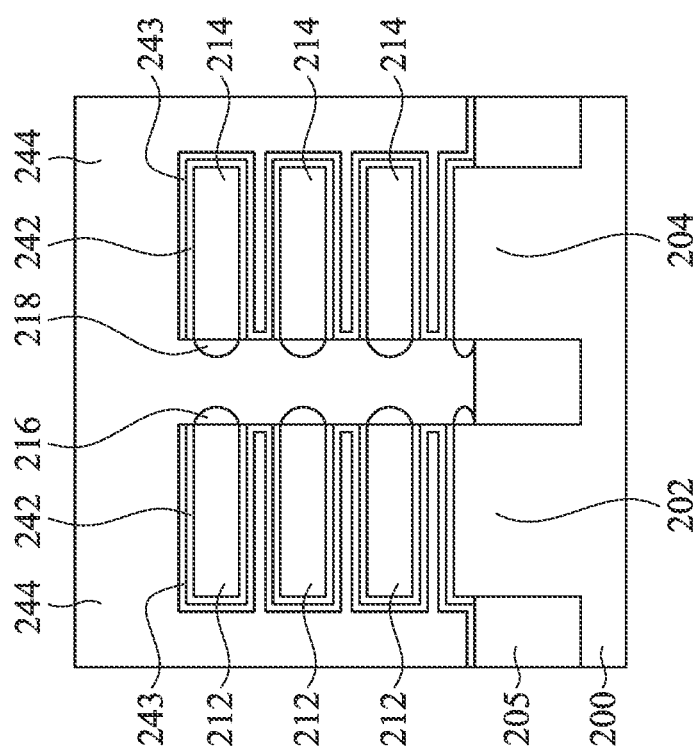

Reference is made to FIGS. 12A and 12B. After the semiconductor layers 216 and 218 are formed, a gate electrode 244 is formed over the gate dielectric layer 243 and the semiconductor layers 216 and 218. As a result, gate structure 240 is formed. In some embodiments, the gate electrode 244 may be formed by suitable deposition process, such as PVD, ACD, ALD, or the like.

FIGS. 13A and 13B are top views of an integrated circuit in accordance with some embodiments of the present disclosure. FIGS. 13A and 13B illustrate top views of the first transistor T5 as described in FIGS. 3A to 3D. As an example, the first transistor T5 of FIGS. 13A and 13B is an N-type device (e.g., NFET), in which the source/drain epitaxy structures 252 and 252 are N-doped, and the semiconductor layer 216 is P-doped. Moreover, the first transistor T5 of FIG. 13A is in Off-state, and the first transistor T5 of FIG. 13B is in On-state. It is noted that operations of On-state and Off-state of a transistor have been discussed in FIGS. 1A to 2C, and thus relevant details will not be repeated for brevity.

Reference is made to FIG. 13A, in which the first transistor T5 of FIG. 13A is in Off-state. In the Off-state, the source/drain epitaxy structure 252 and the gate structure 240 are applied with a low voltage level, such as 0V. On the other hand, the source/drain epitaxy structure 254 is applied with a high voltage level, such as 0.75V. In such condition, current leakage (see arrow in FIG. 13A) may occur from the source/drain epitaxy structure 254 to the gate electrode 244 through the semiconductor layer 216. This is because there is no insulating material (i.e., the gate dielectric layer 242) on the side of the semiconductor layer 212 that is covered by the semiconductor layer 216.

Reference is made to FIG. 13B, in which the first transistor T5 of FIG. 13A is in On-state. In the On-state, the source/drain epitaxy structure 252 is applied with a low voltage level, such as 0V. On the other hand, the gate structure 240 and the source/drain epitaxy structure 254 are applied with a high voltage level, such as 0.75V. In such condition, current leakage (see arrow in FIG. 13B) may occur from gate electrode 244 to the source/drain epitaxy structure 252 through the semiconductor layer 216. This is because there is no insulating material (i.e., the gate dielectric layer 242) on the side of the semiconductor layer 212 that is covered by the semiconductor layer 216.

Figure 14A:
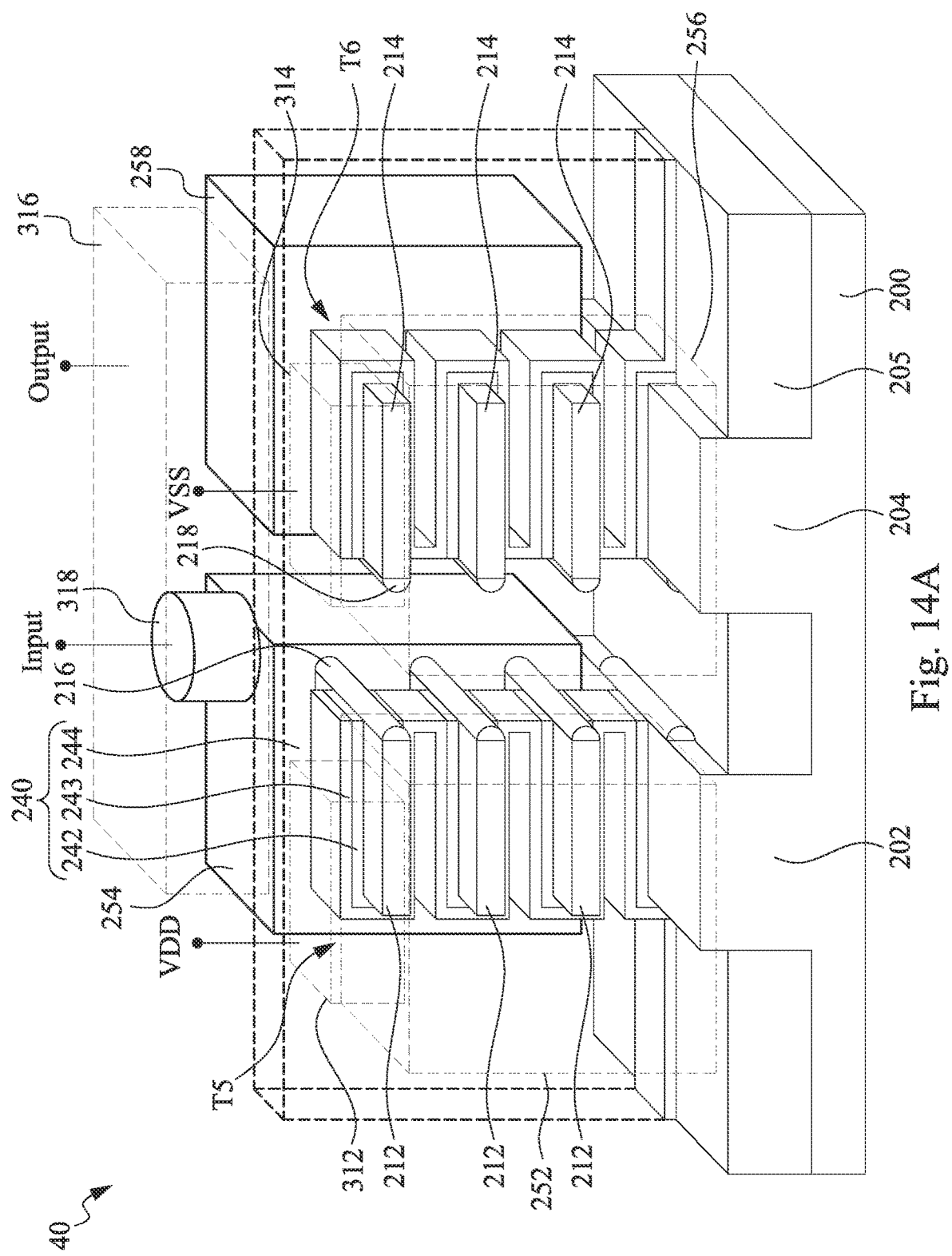
FIG. 14A is a schematic view of an integrated circuit in accordance with some embodiments of the present disclosure.
Figure 14B:
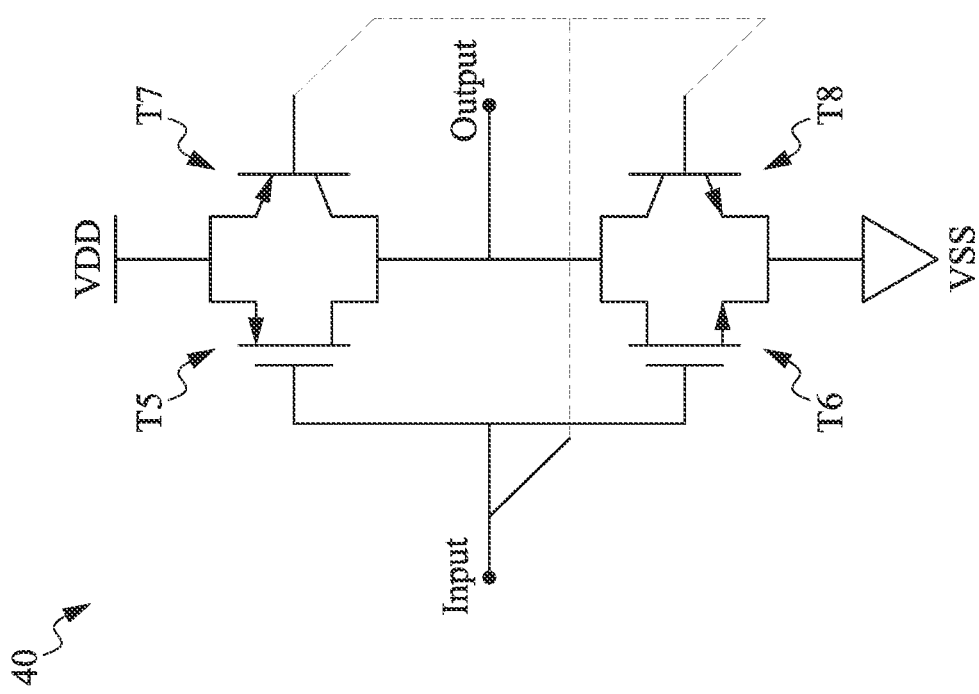
FIG. 14B is a circuit diagram of an integrated circuit in accordance with some embodiments of the present disclosure.

FIG. 14A is a schematic view of an integrated circuit in accordance with some embodiments of the present disclosure. FIG. 14B is a circuit diagram of an integrated circuit in accordance with some embodiments of the present disclosure. In greater details, the circuit diagram of FIG. 14B is an equivalent circuit of the integrated circuit of FIG. 14A. It is noted that some elements of FIG. 14A are the same as those discussed in FIGS. 3A to 3D, such elements are labeled the same, and relevant details will not be repeated for brevity.

Shown there is an integrated circuit 40. In some embodiments, the integrated circuit 40 is an inverter circuit. Generally, an inverter circuit outputs a voltage representing the opposite logic-level to its input.

The integrated circuit 40 includes a first transistor T5 and a second transistor T6. For example, the first transistor T5 is formed by the semiconductor layers 212, the gate structure 240, and the source/drain epitaxy structures 252, 254. Similarly, the second transistor T6 is formed by the semiconductor layers 214, the gate structure 240, and the source/drain epitaxy structures 256, 258.

The integrated circuit 40 includes a third transistor T7 and a fourth transistor T8. In some embodiments, the third transistor T7 and the fourth transistor T8 are bipolar junction transistor (BJT). For example, the third transistor T7 is formed by the source/drain epitaxy structures 252, 254 and the semiconductor layer 216. Similarly, the fourth transistor T8 is formed by the source/drain epitaxy structures 256, 258 and the semiconductor layer 218.

In the embodiments of FIGS. 14A and 14B, the first transistor T5 and the third transistor T7 are P-type devices, while the second transistor T6 and the fourth transistor T8 are N-type devices. That is, the source/drain epitaxy structures 252 and 254 may be P-doped, and the semiconductor layer 216 is N-doped. As a result, the first transistor T5 may be a PFET, and the third transistor T7 may be a P-N-P bipolar junction transistor. On the other hand, the source/drain epitaxy structures 256 and 258 may be N-doped, and the semiconductor layer 218 is P-doped. As a result, the second transistor T6 may be an NFET, and the fourth transistor T8 may be an N-P-N bipolar junction transistor.

The integrated circuit 40 further includes a source/drain contact 312 disposed over the source/drain epitaxy structure 252, in which the source/drain contact 312 is electrically connected to a power supply $V_{DD}$. The integrated circuit 40 further includes a source/drain contact 314 disposed over the source/drain epitaxy structure 256, in which the source/drain contact 314 is electrically connected to a power supply $V_{SS}$. The integrated circuit 40 further includes a source/drain contact 316 disposed over the source/drain epitaxy structures 254 and 258, and electrically connecting the source/drain epitaxy structures 254 and 258 to each other. The source/drain contact 316 is electrically connected to an output terminal. The integrated circuit 40 further includes a gate via 318 disposed over the gate structure 240, in which the gate via 318 is electrically connected to an input terminal.

As mentioned above with respect to FIGS. 3A to 3D, by forming BJTs T7 and T8 electrically connected to the first and second transistors T5 and T6, respectively, and by electrically connecting the bases of the BJTs T7 and T8 to the gates of the first and transistors T5 and T6, respectively. The device performance can be improved.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that, by forming a semiconductor layer on a sidewall of the semiconductor channel layer of a transistor. The semiconductor layer has a different conductivity type than the source/drain epitaxy structures of the transistor, which effectively form a BJT. As a result, the source/drain epitaxy structures can serve as collector and emitter of the BJT (or emitter and collector of the BJT), and the semiconductor layer can serve as a base of the BJT. Furthermore, gate structure of the transistor is in direct contact with the semiconductor layer, which ensures that the gate structure of the transistor and the base of the BJT are applied with a same voltage level. Such configuration will effectively increase the current of the transistor in an On-state, and will effectively reduce the threshold voltage of the transistor.

In some embodiments of the present disclosure, a method includes forming a first semiconductor layer over a substrate; forming a dummy material covering a first sidewall of the first semiconductor layer; forming source/drain epitaxy structures over the substrate and in contact with the first semiconductor layer; forming an interfacial layer on a top surface and a second sidewall of the first semiconductor layer that are uncovered by the dummy material; removing the dummy material to expose the first sidewall of the first semiconductor layer; forming a second semiconductor layer on the first sidewall of the first semiconductor layer after removing the dummy material, in which the second semiconductor layer and the source/drain epitaxy structures have different conductivity types; and forming a gate electrode over the interfacial layer.

In some embodiments, wherein the second semiconductor layer is selectively formed on the first sidewall of the first semiconductor layer.

In some embodiments, the method further includes forming a third semiconductor layer over the substrate prior to forming the first semiconductor layer, the third semiconductor layer being vertically between the first semiconductor layer and the substrate, wherein the dummy material covers a sidewall of the third semiconductor layer; and removing the third semiconductor layer prior to forming the interfacial layer.

In some embodiments, the interfacial layer is formed on a bottom surface of the first semiconductor layer.

In some embodiments, the method further includes forming a gate dielectric layer over the interfacial layer, wherein the gate dielectric layer has a portion is in contact with the dummy material.

In some embodiments, removing the dummy material comprises removing the portion of the gate dielectric layer in contact with the dummy material.

In some embodiments, the method further includes forming a dummy gate structure over the first semiconductor layer and the dummy material; forming gate spacers on opposite sidewalls of the dummy gate structure; and removing the dummy gate structure to expose the dummy material prior to forming the interfacial layer.

In some embodiments, the dummy material is made of a dielectric material.

In some embodiments, the method further includes forming a protrusion portion over the substrate; and forming isolation structures surrounding a bottom portion of the protrusion portion, wherein the dummy material covers a first sidewall of the bottom portion of the protrusion portion, and the interfacial layer covers a top surface and a second sidewall of the bottom portion of the protrusion portion that are uncovered by the dummy material.

In some embodiments of the present disclosure, a method includes forming first and second semiconductor layers over a substrate, the first and second semiconductor layers being laterally separated from each other; forming a dummy material between the first and second semiconductor layers, wherein the dummy material covers a first sidewall of the first semiconductor layer facing the second semiconductor layer, and the dummy material covers a second sidewall of the second semiconductor layer facing the first semiconductor layer; forming first source/drain epitaxy structures in contact with the first semiconductor layer and forming second source/drain epitaxy structures in contact with the second semiconductor layer; removing the dummy material to expose the first sidewall of the first semiconductor layer and the second sidewall of the second semiconductor layer; forming a third semiconductor layer on the first sidewall of the first semiconductor layer and a fourth semiconductor layer on the second sidewall of the second semiconductor layer; and forming a gate electrode over the first and second semiconductor layers.

In some embodiments, the method further includes forming an interfacial layer on surfaces of the first and second semiconductor layers that are uncovered by the dummy material prior to removing the dummy material.

In some embodiments, the method further includes forming a gate dielectric layer over the interfacial layer, wherein the gate dielectric layer extends from the first semiconductor layer, passing through a top surface of the dummy material, to the second semiconductor layer.

In some embodiments, the method further includes forming a dummy gate structure over the first and second semiconductor layers and over the dummy material; and removing the dummy gate structure after forming the first and second source/drain epitaxy structures.

In some embodiments, the third semiconductor layer has a different conductivity type than the first source/drain epitaxy structures, and the fourth semiconductor layer has a different conductivity type than the second source/drain epitaxy structures.

In some embodiments, the gate electrode is in contact with the third and fourth semiconductor layers.

In some embodiments of the present disclosure, a semiconductor device includes a substrate, a first semiconductor layer, a second semiconductor layer, a gate structure, and source/drain epitaxy structures. The first semiconductor layer is over the substrate. The second semiconductor layer covers a first sidewall of the first semiconductor layer. The gate structure is over the first semiconductor layer, the gate structure including an interfacial layer, a gate dielectric layer, and a gate electrode. The second semiconductor layer is wider than the interfacial layer in a top view, and the interfacial layer covering a top surface and a second sidewall of the first semiconductor layer in a cross-sectional view. The gate dielectric layer is over the interfacial layer. The gate electrode is over the gate dielectric layer. Source/drain epitaxy structures on opposite sides of the gate structure.

In some embodiments, the first sidewall of the first semiconductor layer is free from coverage by the interfacial layer.

In some embodiments, the gate electrode is in contact with the interfacial layer and the second semiconductor layer.

In some embodiments, the second semiconductor layer has a different conductivity type than the source/drain epitaxy structures.

In some embodiments, the substrate further comprising a protrusion portion having opposite first and second sidewalls, the first sidewall of the protrusion portion is covered by the interfacial layer of the gate structure, and the second sidewall of the protrusion portion is from coverage by the interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
 forming a first semiconductor layer over a substrate;
 forming a dummy material covering a first sidewall of the first semiconductor layer;
 forming source/drain epitaxy structures over the substrate and in contact with the first semiconductor layer;
 forming an interfacial layer on a top surface and a second sidewall of the first semiconductor layer that are uncovered by the dummy material;
 removing the dummy material to expose the first sidewall of the first semiconductor layer;
 forming a second semiconductor layer on the first sidewall of the first semiconductor layer after removing the dummy material, wherein the second semiconductor layer and the source/drain epitaxy structures have different conductivity types; and
 forming a gate electrode over the interfacial layer.

2. The method of claim 1, wherein the second semiconductor layer is selectively formed on the first sidewall of the first semiconductor layer.

3. The method of claim 1, further comprising:
 forming a third semiconductor layer over the substrate prior to forming the first semiconductor layer, the third semiconductor layer being vertically between the first semiconductor layer and the substrate, wherein the dummy material covers a sidewall of the third semiconductor layer; and
 removing the third semiconductor layer prior to forming the interfacial layer.

4. The method of claim 1, wherein the interfacial layer is formed on a bottom surface of the first semiconductor layer.

5. The method of claim 1, further comprising forming a gate dielectric layer over the interfacial layer, wherein the gate dielectric layer has a portion in contact with the dummy material.

6. The method of claim 5, wherein removing the dummy material comprises removing the portion of the gate dielectric layer in contact with the dummy material.

7. The method of claim 1, further comprising:
 forming a dummy gate structure over the first semiconductor layer and the dummy material;
 forming gate spacers on opposite sidewalls of the dummy gate structure; and
 removing the dummy gate structure to expose the dummy material prior to forming the interfacial layer.

8. The method of claim 1, wherein the dummy material is made of a dielectric material.

9. The method of claim 1, further comprising:
 forming a protrusion portion over the substrate; and
 forming isolation structures surrounding a bottom portion of the protrusion portion, wherein the dummy material covers a first sidewall of the bottom portion of the protrusion portion, and the interfacial layer covers a top surface and a second sidewall of the bottom portion of the protrusion portion that are uncovered by the dummy material.

10. A method, comprising:
 forming first and second semiconductor layers over a substrate, the first and second semiconductor layers being laterally separated from each other;
 forming a dummy material between the first and second semiconductor layers, wherein the dummy material covers a first sidewall of the first semiconductor layer facing the second semiconductor layer, and the dummy material covers a second sidewall of the second semiconductor layer facing the first semiconductor layer;
 forming first source/drain epitaxy structures in contact with the first semiconductor layer and forming second source/drain epitaxy structures in contact with the second semiconductor layer;
 removing the dummy material to expose the first sidewall of the first semiconductor layer and the second sidewall of the second semiconductor layer;
 forming a third semiconductor layer on the first sidewall of the first semiconductor layer and a fourth semiconductor layer on the second sidewall of the second semiconductor layer; and
 forming a gate electrode over the first and second semiconductor layers.

11. The method of claim 10, further comprising forming an interfacial layer on surfaces of the first and second semiconductor layers that are uncovered by the dummy material prior to removing the dummy material.

12. The method of claim 11, further comprising forming a gate dielectric layer over the interfacial layer, wherein the gate dielectric layer extends from the first semiconductor layer, passing through a top surface of the dummy material, to the second semiconductor layer.

13. The method of claim 10, further comprising:
- forming a dummy gate structure over the first and second semiconductor layers and over the dummy material; and
- removing the dummy gate structure after forming the first and second source/drain epitaxy structures.

14. The method of claim 10, wherein the third semiconductor layer has a different conductivity type than the first source/drain epitaxy structures, and the fourth semiconductor layer has a different conductivity type than the second source/drain epitaxy structures.

15. The method of claim 10, wherein the gate electrode is in contact with the third and fourth semiconductor layers.

16. A method, comprising:
- forming a first semiconductor layer over a substrate;
- forming source/drain epitaxy structures in contact with opposite ends of the first semiconductor layer;
- forming a second semiconductor layer on a first sidewall of the first semiconductor layer; and
- after forming the second semiconductor layer, forming a gate electrode over the first semiconductor layer, wherein the gate electrode is further in contact with the second semiconductor layer.

17. The method of claim 16, further comprising, prior to forming the second semiconductor layer, forming an interfacial layer covering a top surface of the first semiconductor layer, a bottom surface of the first semiconductor layer, and a second sidewall of the first semiconductor layer that is opposite to the first sidewall of the first semiconductor layer.

18. The method of claim 17, further comprising:
- forming a dummy material covering the first sidewall of the first semiconductor layer prior to forming the interfacial layer; and
- removing the dummy material to expose the first sidewall of the first semiconductor layer prior to forming the second semiconductor layer.

19. The method of claim 17, further comprising forming a gate dielectric layer over the interfacial layer.

20. The method of claim 16, wherein the second semiconductor layer and the source/drain epitaxy structures have different conductivity types.

* * * * *